(12) United States Patent
Ooishi

(10) Patent No.: US 6,301,166 B1
(45) Date of Patent: Oct. 9, 2001

(54) PARALLEL TESTER CAPABLE OF HIGH SPEED PLURAL PARALLEL TEST

(75) Inventor: Tsukasa Ooishi, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/624,601

(22) Filed: Jul. 25, 2000

Related U.S. Application Data

(62) Division of application No. 08/942,691, filed on Sep. 29, 1997, now Pat. No. 6,122,190, which is a division of application No. 08/589,358, filed on Jan. 22, 1996, now Pat. No. 5,717,652.

(30) Foreign Application Priority Data

Jun. 21, 1995 (JP) .................................... 7-155015

(51) Int. Cl.⁷ .................................................. G11C 7/00
(52) U.S. Cl. ........................................... 365/201; 365/233
(58) Field of Search .................................. 365/201, 233, 365/189.01, 230.01

(56) References Cited

U.S. PATENT DOCUMENTS

| | | |
|---|---|---|
| 4,399,519 | 8/1983 | Masuda et al. . |
| 4,984,210 | 1/1991 | Kumanoya . |
| 4,985,868 | 1/1991 | Nakano . |
| 5,317,532 | 5/1994 | Ochii . |
| 5,343,438 | 8/1994 | Choi . |
| 5,528,535 | 6/1996 | Honjo . |
| 5,703,522 | 12/1997 | Arimoto et al. . |
| 5,771,188 | 6/1998 | Fink . |

OTHER PUBLICATIONS

"A Delay Line Loop for Frequency Synthesis of De–Showed Clock" by Walzman, ISSCC94, pp. 298–299.
"A 2.5 V Delay–Locked Loop for an 18Mb 500MB/s DRAM" by Lee et al., ISSCC94, pp. 300–301.
"PLL Design for a 500MB/s Interface" by Holowitz et al., ISSCC93, pp. 160–161.
"A 55ns 16Mb DRAM" by Takeshima et al., ISSCC89, pp. 246–247.
"A 30ns 64Mb DRAM with Built–in Self–test and Repair Function" by Koike et atl., ISSCC92, pp. 150–151.

Primary Examiner—Hoai V. Ho
(74) Attorney, Agent, or Firm—McDermott, Will & Emery

(57) ABSTRACT

A test mode control circuit detects designation of a test mode in accordance with a combination of external control signals and address signals, and activates an internal period setting circuit. Internal period setting circuit generates a clock signal having a prescribed period when activated, and applies it to a control circuit. In accordance with the test mode designating signal from test mode setting circuit and the clock signal from internal period setting circuit, control circuit causes an internal address generating circuit to generate an internal address signal successively in synchronization with the clock signal, so that a word line of a memory array is selected.

1 Claim, 39 Drawing Sheets

20a

PARALLEL TESTER CAPABLE OF HIGH SPEED PLURAL PARALLEL TEST

This application is a Divisional of application Ser. No. 08/942,691 filed Sep. 29, 1997, now U.S. Pat. No. 6,122,190 which is Divisional of application Ser. No. 08/589,358 filed Jan. 22, 1996, now U.S. Pat. No. 5,717,652.

BACKGROUND OF THE INVENTION

1. Field of the Invention

The present invention relates to a semiconductor memory device and a parallel test therefor and, more specifically, to a semiconductor memory device and a structure of a parallel tester for performing test of semiconductor memory devices at a high speed.

2. Description of the Background Art

As memory capacity of a semiconductor memory device, specially of a dynamic type RAM (hereinafter referred to as a DRAM) has been increased, time necessary for testing the semiconductor memory device has been remarkably increased.

The reason why this problem occurs is that the more the storage capacity of the semiconductor memory device, the larger the number of word lines included therein, and therefore the longer becomes the time for writing and reading memory cell information while successively selecting the word lines.

The aforementioned problem is more serious in an acceleration test such as a burn in test. In the burn in test, a semiconductor memory device is operated under a high temperature and high voltage condition in order to reveal potential initial failure such as defect in gate insulating film of an MOS transistor, which is a component of the device, defect in an interlayer insulating film between interconnections, defect in interconnection and defect caused by particles introduced during the steps of manufacturing, and to eliminate defective products before shipment.

The above described burn in test is essential in maintaining quality of the products to be shipped. The increase in time for the test is directly related to increase of manufacturing cost of the semiconductor memory device.

The problem of longer test time is also experienced in a reliability test such as a life test.

FIG. 45 schematically shows a structure of a conventional apparatus for performing burn in test.

Referring to FIG. 45, on a test board TB, semiconductor memory devices DR11 to DRmn are arranged in a matrix of m rows x n columns. The semiconductor memory devices DR11 to DRmn are connected to each other by a signal bus SG.

During testing, a control signal and a clock signal are output to test board TB from a test signal generating circuit TA. The control signal and the clock signal are transmitted to each semiconductor memory device by the signal bus SG.

In the burn in test, first, data at a high level is written to each memory cell of the semiconductor memory devices DR11 to DRmn. Thereafter, a row address strobe signal /RAS and an address signal are applied from test signal generating circuit TA to signal bus SG, and in semiconductor memory devices DR11 to DRmn, a word line is selected and sense amplifier circuit operates. The memory cell information amplified by the sense amplifier circuit is compared with the test data written in advance, and thus malfunction of each semiconductor memory device is detected.

The above described operation is continuously carried out for a prescribed time period under prescribed accelerating conditions.

FIG. 47 schematically shows a whole structure of a conventional dynamic semiconductor memory device. Referring to FIG. 47, the dynamic semiconductor memory device 1 includes a control circuit 18 receiving external control signals /WE, /OE, /RAS and /CAS applied through external control signal input terminals 2 to 5 for generating internal control signals; a memory cell array 7 in which memory cells are arranged in a matrix; an address buffer 9 receiving external address signals AO to Ai applied through an address signal input terminal 8 for generating an internal row address signal and an internal column address signal under the control of the control circuit 18; an internal address generating circuit 10 for generating a refresh row address signal for designating a row to be refreshed during refreshing operation under the control of control circuit 18; a multiplexer 11 for selectively passing any of the address signals from address buffer 9 and internal address generating circuit 10 under the control of control circuit 18; and a row decoder 12 which is activated under the control of control circuit 18 for decoding the internal row address signal applied from multiplexer 11 to select a row of the memory cell array 7.

The signal /WE applied to external control signal input terminal 2 is a write enable signal designating data writing. The signal /OE applied to external control signal input terminal 3 is an output enable signal designating data output. The signal /RAS applied to the external control signal input terminal 4 is a row address strobe signal for starting internal operation in the semiconductor memory device and for determining active time period of the internal operation. While the signal /RAS is active, circuits related to an operation of selecting a row in the memory cell array 7 are activated. The signal /CAS applied to external control signal input terminal 5 is a column address strobe signal, which activates a circuit for selecting a column in memory cell array 7.

Semiconductor memory device 1 further includes a column decoder 13 which is activated under the control of control circuit 18 for decoding an internal column address signal from address buffer 9 and generating a column selecting signal for selecting a column of the memory cell array 7; a sense amplifier sensing and amplifying data of a memory cell connected to the selected row of the memory array 7; an IO gate responsive to a column selection signal from column decoder 13 for connecting the selected column of the memory cell array 7 to an internal data bus a1; an input buffer 15 for generating an internal write data from external write data DQ0 to DQj applied to data input terminal 17 at the time of data writing and transmitting thus generated data to internal data bus a1, under the control of control circuit 18; and an output buffer 16 for generating external read data DQ0 to DQj from internal read data read to internal data bus a1 at the time of data reading and outputting thus generated read data to data input/output terminal 17, under the control of control circuit 6.

Referring to FIG. 47, the sense amplifier and the IO gate are represented by one block 14. Input buffer 15 is activated when the signals /WE and /CAS are both at the active state of low level and generates the internal write data. Output buffer 16 is activated in response to the activation of the output enable signal /OE.

As described above, the operation of the DRAM is controlled by the aforementioned external signals /WE, /OE, /RAS and /CAS as well as address signals A0 to Ai.

Therefore, even in the burn in test, these signals are applied from test signal generating circuit TA to each of the semiconductor memory devices DR11 to DRmn.

In the above described burn in test, in order to suppress increase in test time even when the memory capacity of each semiconductor memory device is increased, the control signal /RAS transmitted from test signal generating circuit TA to signal bus SG shown in FIG. 45 may be changed at high speed, so as-to shorten the time necessary for the word line to be selected.

However, a large number of semiconductor memory devices DR11 to DRmn are connected to signal bus SG, and there is a large parasitic capacitance Cp at signal bus SG, as shown in FIG. 45. Therefore, because of interconnection resistance and the large parasitic capacitance of the signal bus SG, there is a signal propagation delay, and hence increase in speed of changing said signal is limited.

FIG. 46 shows the change in the control signal /RAS and of the address signal on signal bus SG, as an example.

FIG. 46(A) shows an ideal signal waveform on signal bus SG, and FIG. 46(B) shows a signal waveform on signal bus SG in the conventional burn in test. As shown in FIG. 46(A), in the ideal state, the signal /RAS changes with a prescribed rise time and a prescribed fall time, not influenced by the signal propagation delay. The address signal requires a set up time Ts and a hold time Th with respect to the signal /RAS. The set up time Ts is necessary for the address signal to be in the established state before the fall of the signal /RAS. The hold time Th is necessary for maintaining the established state of the address signal from the fall of the signal /RAS.

If the signal bus SG has large parasitic capacitance Cp, the rise time and the fall time of the control signal /RAS become longer because of the signal propagation delay on signal bus SG, and the waveform is deformed as shown in FIG. 46(B). Therefore, it becomes impossible to change the control signal /RAS at high speed.

At this time, the speed of change of the address signal also becomes slower. In order to ensure the address set up time Ts, it is necessary to change the address signal at an earlier timing than the timing of change of the address signal in the ideal waveform (FIG. 46(A)). Since the address signal is changed while the control signal /RAS is at an inactive state of high level, the period in which the control signal /RAS is inactive becomes longer than in the ideal waveform.

As a result, the time period for one cycle (word line selection cycle) of the burn in test 1 becomes longer, the word lines cannot be successively selected at high speed, and hence the time necessary for the burn in test cannot be reduced.

In the burn in test, prescribed memory information is written in each memory cell in advance, and it is compared with an expected value which is the information successively read and written by successively selecting the word lines, so that data bit error is detected and defective products can be found. If it is difficult to change the control signal /RAS at a high speed as described above, the time necessary for the test is also increased since the time for the cycle of writing a signal, which is the aforementioned expected value in advance is increased.

SUMMARY OF THE INVENTION

Therefore, an object of the present invention is to provide a semiconductor memory device capable of executing test mode operation such as a burn in test at a high speed.

Another object of the present invention is to provide a parallel tester capable of reducing time when a plurality of semiconductor memory devices are tested, as the aforementioned signal with respect to each of the semiconductor memory devices can be changed at high speed.

A still further object of the present invention is to provide a semiconductor memory device capable of significantly reducing time for writing initial memory information, which will be an expected value in an operation test to each memory cell, and to provide a method of operation therefor.

Briefly speaking, in the present invention, clock generating circuitry which is activated in a test mode for generating an internal clock signal is provided in a semiconductor memory device, and the clock signal is utilized as a word line selecting operation activating signal.

More specifically, the semiconductor memory device in accordance with one aspect of the present invention includes a memory cell array including a plurality of memory cells arranged in a matrix; a clock generating circuit responsive to one external test mode designating signal for generating a clock signal of a prescribed period while the test mode designating signal is active; an internal address generating circuit responsive to the test mode designating signal and the clock signal for successively generating internal address signals in synchronization with the clock signal; an address signal switching circuit receiving the external address signal and the internal address signal, for outputting either of these in response to the test mode designating signal; and a row selecting circuit operating in synchronization with the clock signal for selecting, in response to an output from the address signal switching circuit, the corresponding row of the memory cell array.

According to another aspect of the present invention, a clock generating circuit which is activated in the test mode for generating an internal clock signal in synchronization with an externally applied clock signal is provided in the semiconductor memory device, and the internal clock signal is utilized as the word line selecting operation activating signal.

More specifically, the semiconductor memory device includes a memory cell array including a plurality of memory cells arranged in a matrix; a first clock generating circuit responsive to an external test mode designating signal, for receiving an external clock signal and generating a first internal clock signal in synchronization with the external clock signal while the test mode designating signal is active; an internal address generating circuit responsive to the test mode designating signal and the first internal clock signal, for successively generating internal address signals in synchronization with the first internal clock signal; an address signal switching circuit receiving the external address signal and the internal address signal for outputting either of these in accordance with the test mode designating signal; and a row selecting circuit operating in synchronization with the clock signal and selecting a corresponding row of the memory cell array in accordance with the output from the address signal switching circuit.

According to a still further aspect of the present invention, an internal clock signal generating circuit which is activated in the test mode, receiving an external clock signal and generating an internal clock signal which is obtained by multiplying the external clock signal is provided in the semiconductor memory device, and the internal clock signal is utilized as the word line selecting operation activating signal.

More specifically, the semiconductor memory device includes a memory cell array including a plurality of memory cells arranged in a matrix; a first clock generating circuit responsive to an external test mode designating signal for receiving an external clock signal and generating a first internal clock signal by multiplying said external clock signal while said test mode designating signal is active; an internal address generating circuit responsive to an operation mode designating signal and the first internal clock signal for successively generating internal address signals in synchronization with the first internal clock signal; an address signal switching circuit receiving the external go address signal and the internal address signal for outputting either of these in response to the operation mode designating signal; and a row selecting circuit operating in synchronization with the clock signal for selecting a corresponding row of the memory cell array in accordance with the output from the address signal switching circuit.

According to a still further aspect of the present invention, when a plurality of semiconductor memory devices divided into a plurality of subgroups are to be subjected to operation test parallel to each other and in synchronization in accordance with an external clock signal, a circuit receiving the external clock signal for generating synchronized internal test clock signals for each subgroup is provided, and the semiconductor memory devices are tested in parallel at high speed.

More specifically, a parallel tester for performing operation test of a plurality of semiconductor memory devices in parallel and in synchronization in accordance with an externally input external clock signal includes an internal test clock generator provided for each subgroup of a plurality of semiconductor memory devices divided into a plurality of subgroups, receiving the external clock signal for generating a synchronized internal test clock signal; and a data bus line for transmitting the internal test clock signal to each of the semiconductor memory devices of the subgroup.

According to a still further aspect of the present invention, when data is to be written to the memory cell of the semiconductor memory device, the well potential of the memory cell transistor constituting the memory cell is controlled independent from the cell plate potential of a memory cell capacitor, so that memory information is written collectively.

More specifically, the semiconductor memory device according to this aspect includes: a memory cell array including a plurality of word lines, a plurality of bit line pairs crossing the plurality of word lines and a plurality of memory cells connected to the word lines and the bit line pairs, each memory cell including a first electrode, a second electrode opposing to the first electrode with an insulating film interposed, and a memory cell transistor of a first conductivity type formed in a well of a second conductivity type, having its gate connected to the word line and connecting/disconnecting the second electrode to the bit line; the semiconductor memory device further includes a first interconnection commonly connected to the wells of the second conductivity type of the memory cells, a second interconnection commonly connected to the first electrodes of the memory cells and a potential controlling circuit capable of controlling the potentials of the first and second interconnections independent from each other.

Therefore, an advantage of the present invention is that acceleration test is possible without any influence of distortion in waveform of an external clock signal, since the clock generating circuit generates an internal clock signal of a prescribed period in accordance with one external test mode designating signal and the semiconductor memory device operates in accordance with the internal clock signal.

Another advantage is that acceleration test is possible without any influence of the distortion in waveform of the external clock signal, since, in accordance with an external test mode designating signal, a first internal clock signal in synchronization with the external clock signal is generated and semiconductor memory device operates accordingly.

A further advantage is that acceleration test is possible without any influence of distortion in the waveform of the external clock signal, since, in accordance with an external test mode designating signal, an internal clock signal is generated by multiplying an external clock signal and the semiconductor memory device operates accordingly.

A further advantage of the present invention is that even when a number of semiconductor memory devices are to be tested in parallel, distortion in clock signal applied to each of the semiconductor memory devices can be suppressed, since the plurality of semiconductor memory devices to be tested in parallel are divided into a plurality of subgroups, and an internal test clock generating circuit for generating, in response to an external clock signal, a synchronized internal test clock is provided for each subgroup of the semiconductor memory devices.

A still further advantage of the present invention is that memory information for testing can be written collectively to a plurality of memory cells, since well potentials and the plate potential of each memory cell is controlled independent from each other by a potential control circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 11:
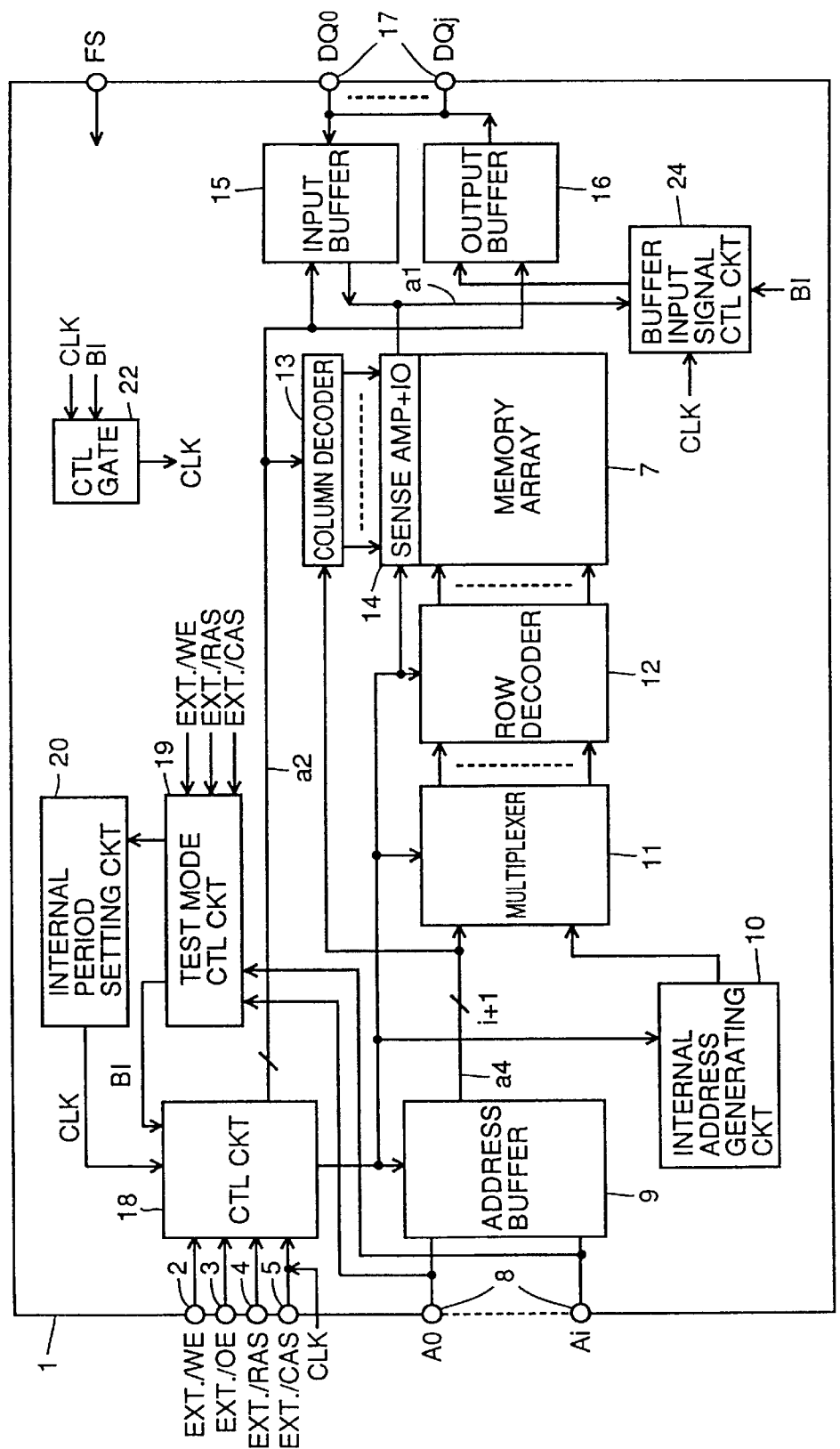
FIG. 11 is a schematic block diagram showing a structure of a semiconductor memory device in accordance with a third embodiment of the present invention.

FIG. 11 schematically shows a whole structure of a semiconductor memory device in accordance with a first embodiment of the present invention.

Figure 1:
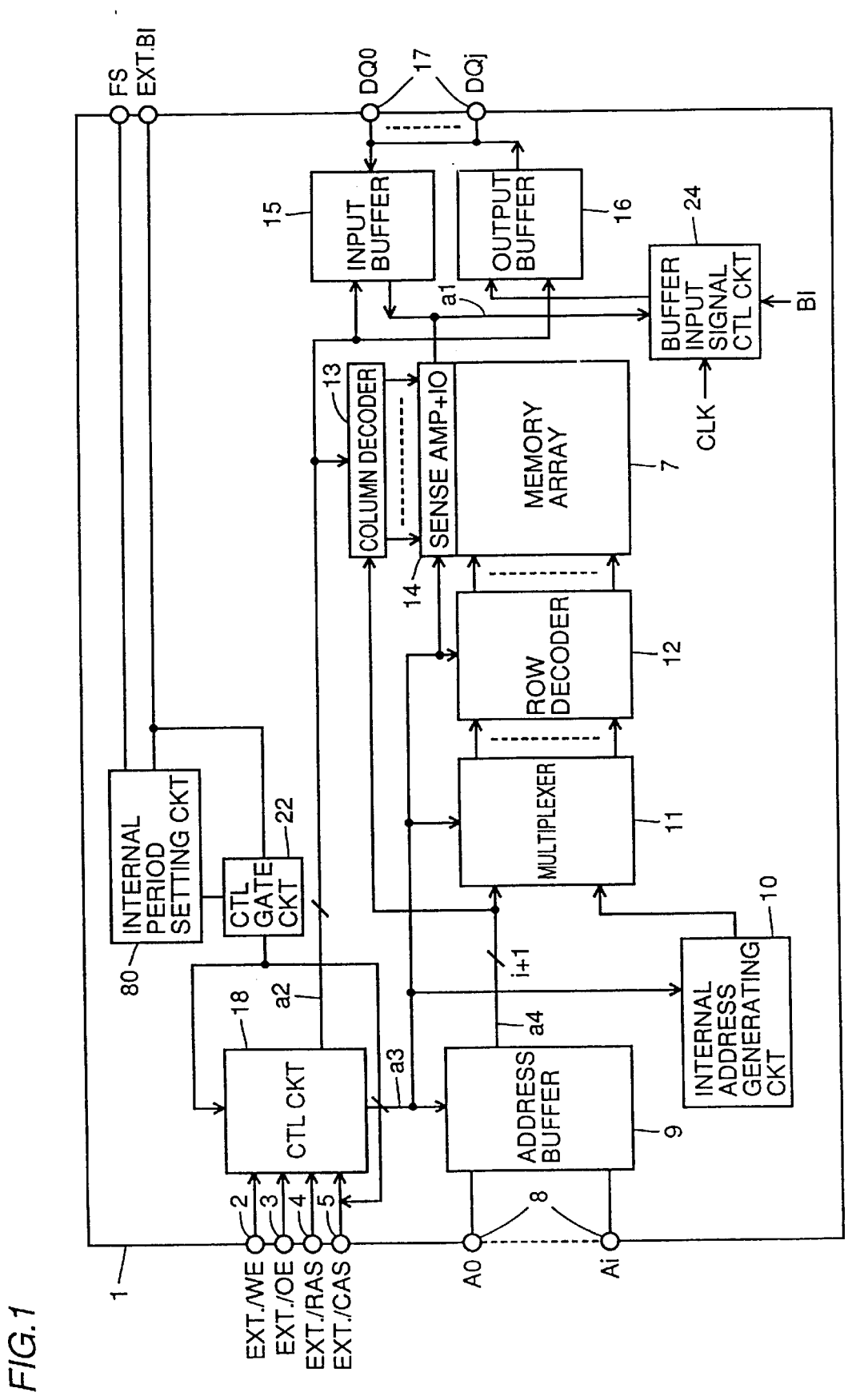
FIG. 1 is a schematic block diagram showing a structure of a semiconductor memory device in accordance with a first embodiment of the present invention.

Referring to FIG. 1, the semiconductor memory device 1 includes a control circuit 18 receiving external control signals EXT./WE, EXT./OE, EXT./RAS and EXT./CAS for generating various internal control signals; an internal period setting circuit 20 receiving an external test mode designating signal EXT.BI for starting output of an internal clock signal CLK, and in accordance with an external internal clock period control signal FS for changing the period of the internal clock signal CLK to be output; a control gate circuit 22 receiving the internal clock signal CLK for outputting, in accordance with the external control signal EXT.BI, the internal clock signal CLK to an external terminal 5 to which the signal /CAS is input and to a control circuit 6; and a buffer input signal control circuit 24 receiving outputs from a sense amplifier circuit and from the input/output control circuit 14 and the internal clock signal CLK, for outputting the clock signal CLK to the output buffer 16 while the external control signal EXT.BI is active, and for outputting the output signals from the sense amplifier and the input/output control circuit 14 to output buffer 16 while the signal EXT.BI is inactive.

Figure 47:
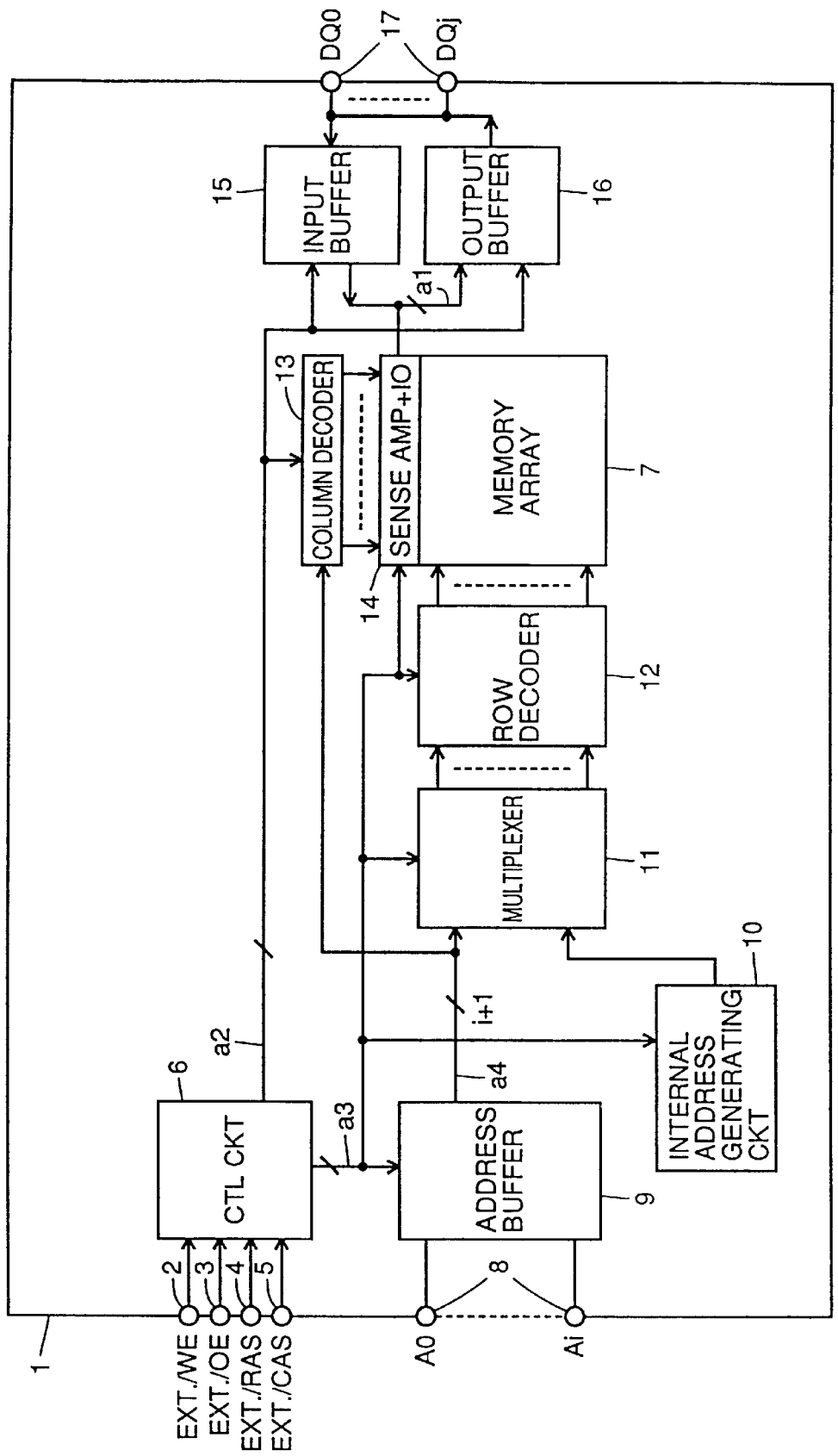
FIG. 47 is a schematic block diagram showing a structure of a conventional semiconductor memory device.

The internal clock signal CLK generated by the internal period setting circuit 20 is applied to a control circuit 18 as a row selecting operation activating signal (internal RAS). Control circuit 18 activates the row selecting operation activating signal in synchronization with the clock signal CLK from internal period setting circuit 20 when the test mode is designated by the external signal EXT.BI. Except these points, the structure is the same as the conventional semiconductor memory device shown in FIG. 47, and corresponding portions are denoted by the same reference characters. Therefore, detailed description thereof is not repeated.

Figure 2:
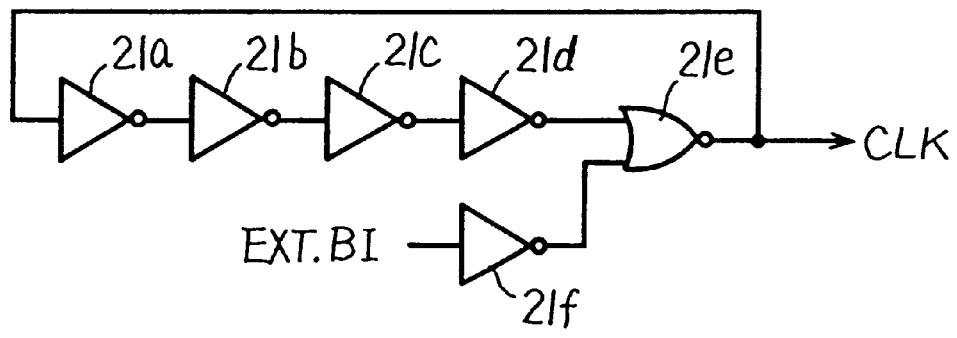
FIG. 2 is a schematic diagram showing a first example of an internal period setting circuit in accordance with the first embodiment of the present invention.

FIG. 2 shows an example of the structure of internal period setting circuit 20 shown in FIG. 1. Referring to FIG. 2, internal period setting circuit 20 includes cascade connected plural stages (in FIG. 2, four stages) of inverters 21a to 21d, and an NOR gate 21e receiving an output signal from inverter 21d and the test mode designating signal EXT.BI through an inverter 21f. The number of stages of the inverters 21a to 21d may be appropriately set in accordance with the period of the clock signal CLK to be generated.

Therefore, when the circuit shown in FIG. 2 is used as the internal period setting circuit 20, the period of the clock signal CLK, which is the output therefrom is fixed at a prescribed period set in advance.

Figure 3:
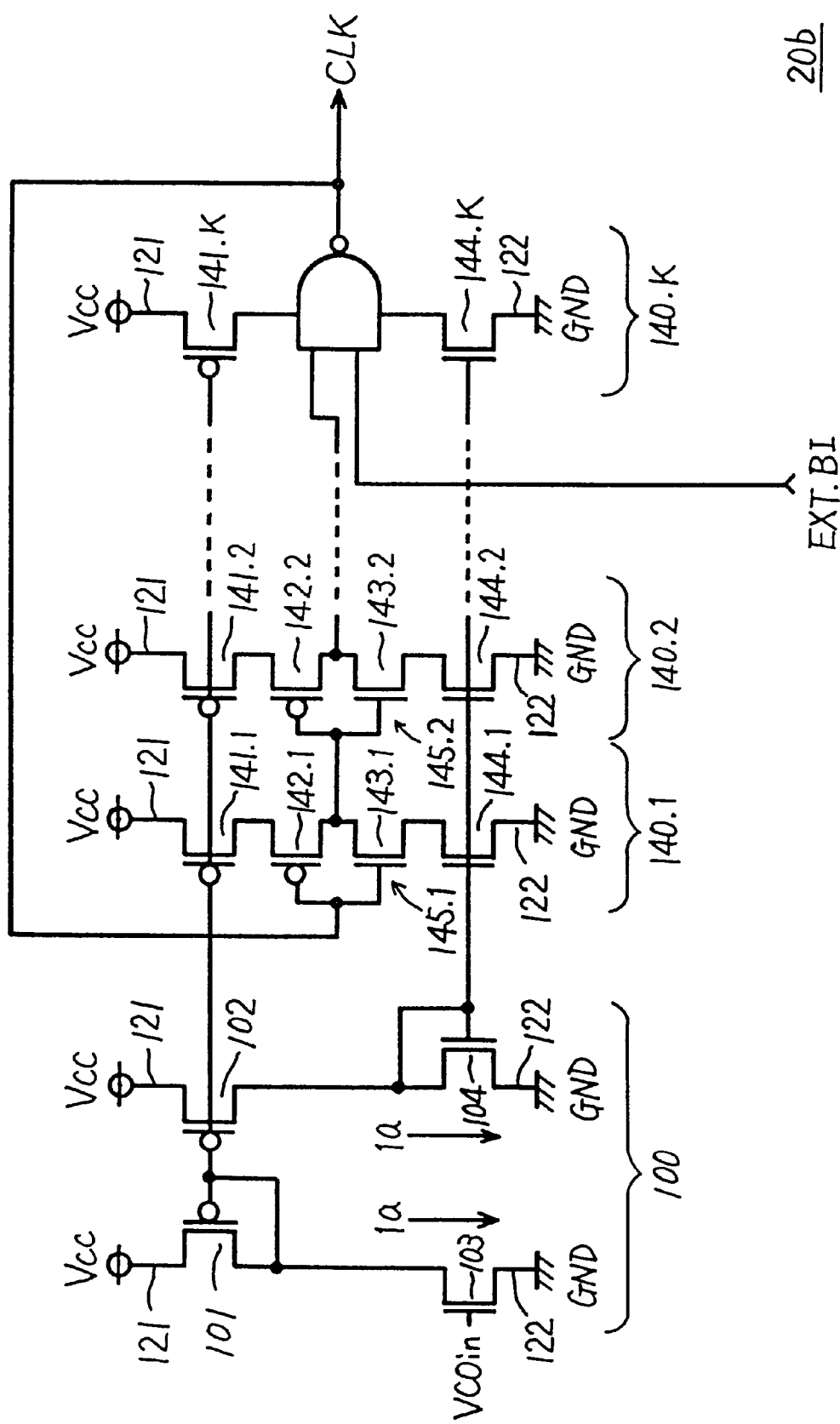
FIG. 3 is a schematic diagram showing a second example of the internal period setting circuit in accordance with the first embodiment of the present invention.

FIG. 3 shows another example of the structure of the internal period setting circuit 20 shown in FIG. 1. Referring to FIG. 3, the internal period setting circuit 20b includes K-1 (K is an odd number) delay time variable elements 110.1 to 110.K-1 connected in series with a bias generating circuit 100. The internal period setting circuit 20b further includes a delay time variable element 110.K which is connected to the last stage of the aforementioned delay time variable elements connected in series, start of operation of which is controlled by the test mode designating signal EXT.BI.

Bias generating circuit 100 includes a P channel MOS transistors 101 and 102, as well as N channel MOS transistors 103 and 104. P channel MOS transistor 101 and N channel MOS transistor 103 are connected in series between a power supply line 121 and a ground potential line 122. P channel MOS transistor 102 and N channel MOS transistor 104 are connected in series between power supply potential line 121 and ground potential line 122. P channel MOS transistors 101 and 102 have their gates commonly connected and to the drain of P channel MOS transistor 101. More specifically, P channel MOS transistors 101 and 102 constitute a current mirror circuit. N channel MOS transistor 103 receives at its gate an internal clock period control signal FS. N channel MOS transistor 104 has its gate connected to its drain.

To N channel MOS transistor 103, a current Ia which increases/decreases in accordance with the internal clock period control signal FS flows. MOS transistors 103 and 101 are connected in series, MOS transistors 101 and 102 constitute a current mirror circuit, and MOS transistors 102 and 104 are connected in series. Therefore, the same current Ia flows through these four MOS transistors 101 to 104, provided that the MOS transistors 101 and 102 have the same transistor size.

Delay time variable element 110.1 includes P channel MOS transistors 111.1 and 112.1 and N channel MOS transistors 113.1 and 114.1 connected in series between power supply potential line 121 and ground potential line 122. P channel MOS transistor 111.1 has its gate connected to the gate of P channel MOS transistor 102 of bias generating circuit 110. MOS transistors 112.1 and 113.1 have their gates commonly connected, and MOS transistors 112.1 and 113.1 constitute an inverter 115.1.

N channel MOS transistor 114.1 has its gate connected to the gate of N channel MOS transistor 104 of bias generating circuit 100. This is the same in other delay time variable elements 110.2 to 110.K-1. Inverters 115.1 to 115.K-1 are connected in series. An output of NAND circuit 115. K is connected to the input of inverter 115.1.

The operation of the internal period generating circuit 20b shown in FIG. 3 will be described. P channel MOS transistors 111.1 to 111.K have their gates both connected to the gate of P channel MOS transistor 102, and N channel MOS transistors 114.1 to 114.K are connected to the gate of N channel MOS transistor 104. Therefore, the current Ia corresponding to the internal clock period control signal FS flows through each of the delay time variable elements 110.1 to 110.K.

When the internal clock period control signal FS increases and the current Ia increases, the time of inversion of each of the inverters 115.1 to 115.K-1 as well as the time of inversion of NAND circuit 115.K becomes shorter, and thus period of oscillation of the internal period setting circuit 20b becomes shorter.

When the internal clock period control signal FS decreases and the current Ia decreases, the time for inversion of the inverters 115.1 to 115.K-1 and of NAND circuit 115.K becomes longer, and thus the period of oscillation of internal period setting circuit 20b becomes longer.

While the test mode designating signal EXT.BI is at the "L" level, the NAND circuit 115.K is inactive, and hence the output from internal period setting circuit 20b is stopped.

The above described structure enables the operation of the internal period setting circuit 20b, of which start and stop is controlled by the test mode designating signal EXT.BI, and period of oscillation controlled by the internal clock period control signal FS.

Figure 4:
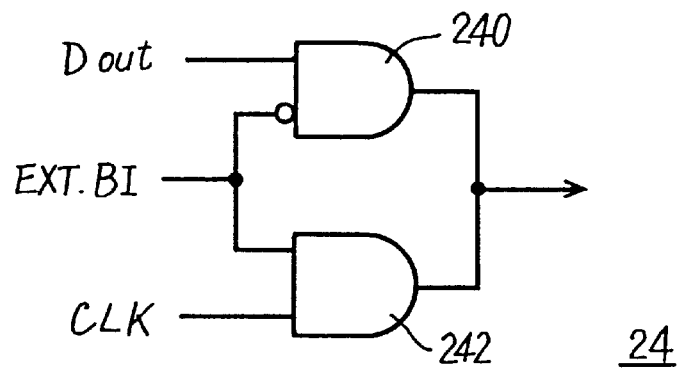
FIG. 4 is a schematic diagram showing a control gate circuit in accordance with the first embodiment of the present invention.

FIG. 4 is a schematic diagram showing an example of the structure of buffer input signal control circuit 24 shown in FIG. 1.

Buffer input signal control circuit 24 includes an NAND circuit 240 receiving as inputs, an output signal Dout from sense amplifier and input/output control circuit 14 and an inverted signal of test mode designating circuit EXT.BI, and an NAND circuit 242 receiving as inputs the internal clock signal CLK output from the internal period setting circuit 20 and the test mode designating signal EXT.BI. While the test mode designating signal EXT.BI is at the "L" level, NAND gate 240 is opened and a signal Dout is output.

Meanwhile, if the test mode designating signal EXT.BI is at "H" level, NAND gate 242 is opened, and the clock signal CLK is output.

By the above described structure, it is possible to continuously operate the output buffer circuit even in the test mode period, and hence acceleration test of the output buffer and the internal circuitry can be simultaneously performed in the acceleration test such as the burn in test mode.

In the present embodiment, only the output buffer circuit 16 is set to the operative state during the test period. However, a structure may be possible in which both the input buffer circuit 15 and the output buffer circuit 16 are set to the operative state in the test mode period.

Figure 5:
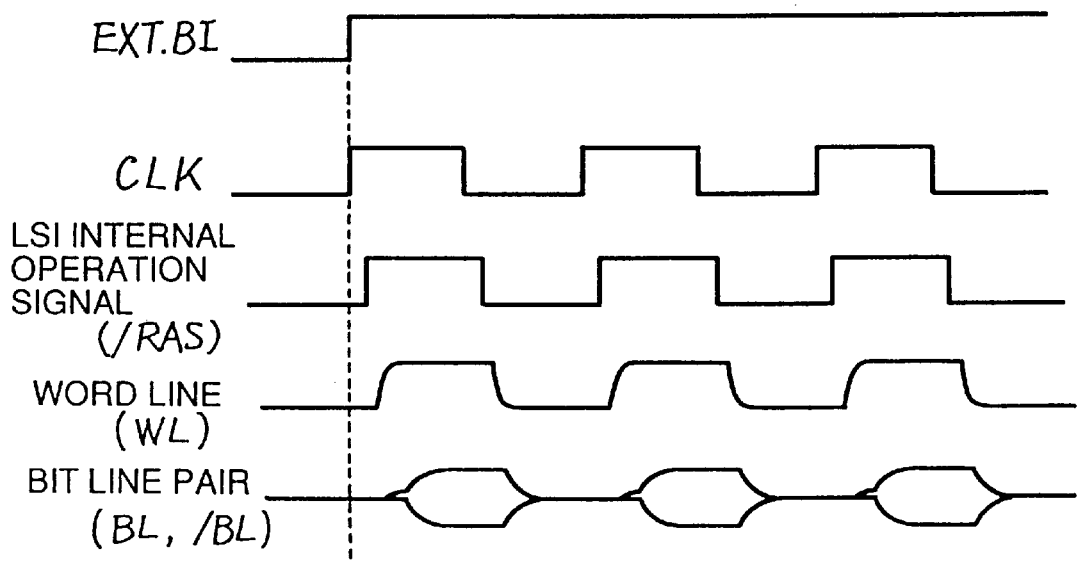
FIG. 5 is a diagram of waveforms showing an operation of the first embodiment of the present invention.

FIG. 5 is a diagram of signal waveforms showing the operation of the present invention.

Figure 45:
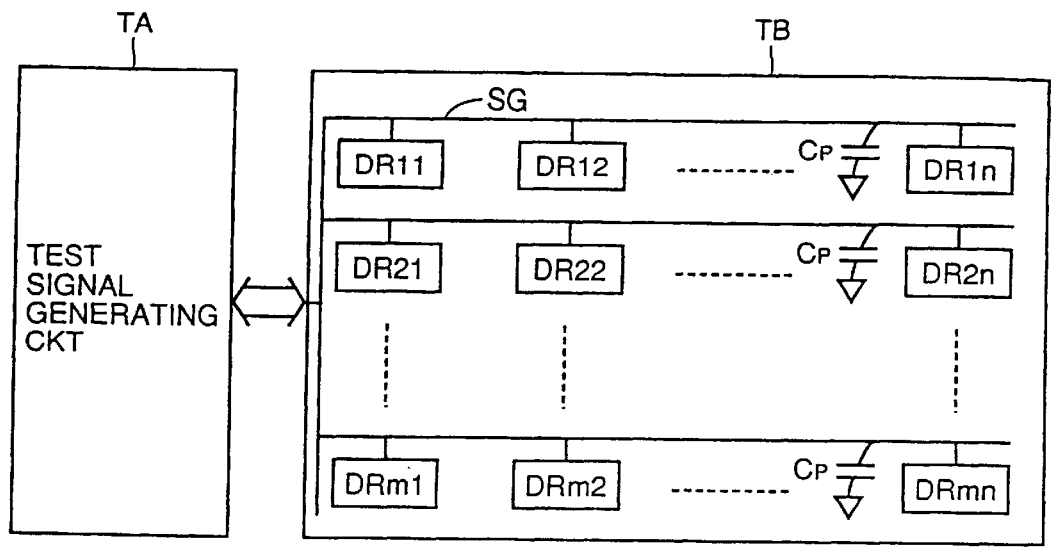
FIG. 45 is a schematic block diagram showing a structure of a conventional parallel tester.
Figure 46:
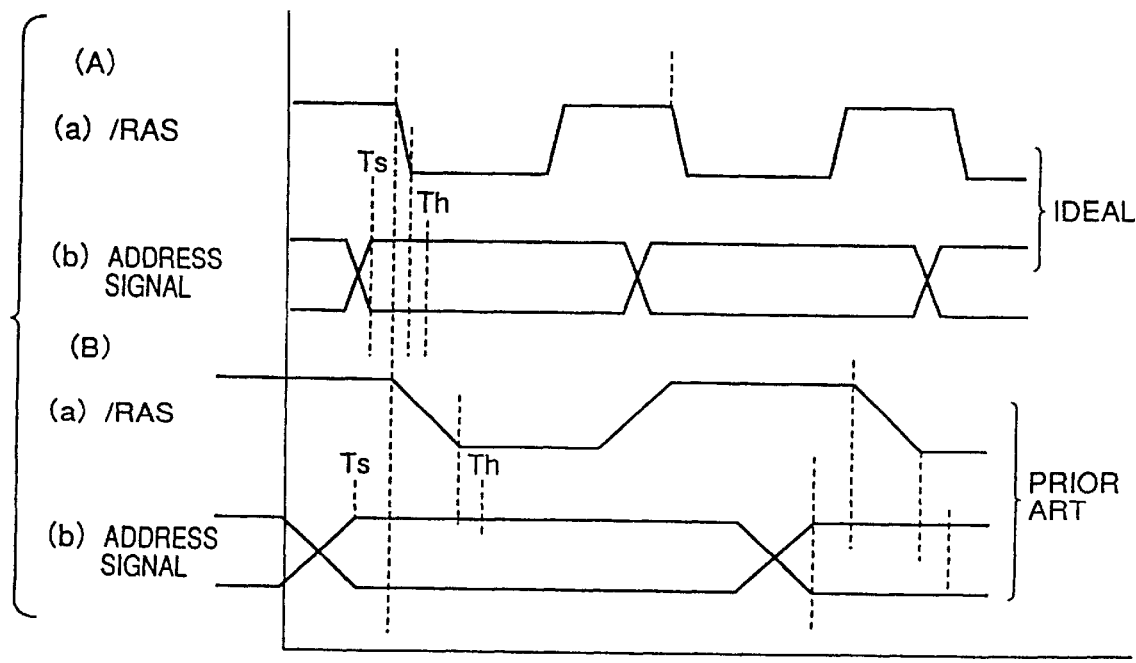
FIG. 46 is a diagram of waveforms showing a clock signal in the conventional parallel tester.

After the test mode designating signal EXT.BI rises from the "L" level to the "H" level, the semiconductor memory device 1 operates in accordance with the internal clock signal CLK which is the output from internal period setting circuit 20, a word line is driven, and potential difference between a bit line pair (BL, /BL) is amplified corresponding to the memory cell information. Therefore, when a number of semiconductor memory devices are arranged on one board and test of operation is to be performed simultaneously as shown in FIG. 45, the internal clock signal in each semiconductor memory device can maintain prescribed period and prescribed waveform, regardless of any distortion in the waveform of the external test signal.

Therefore, by applying test mode designating signal EXT.BI as an external trigger, each semiconductor memory device 1 can operate at high speed without any influence by the parasitic capacitance or the like existing on the board.

Second Embodiment

Figure 6:
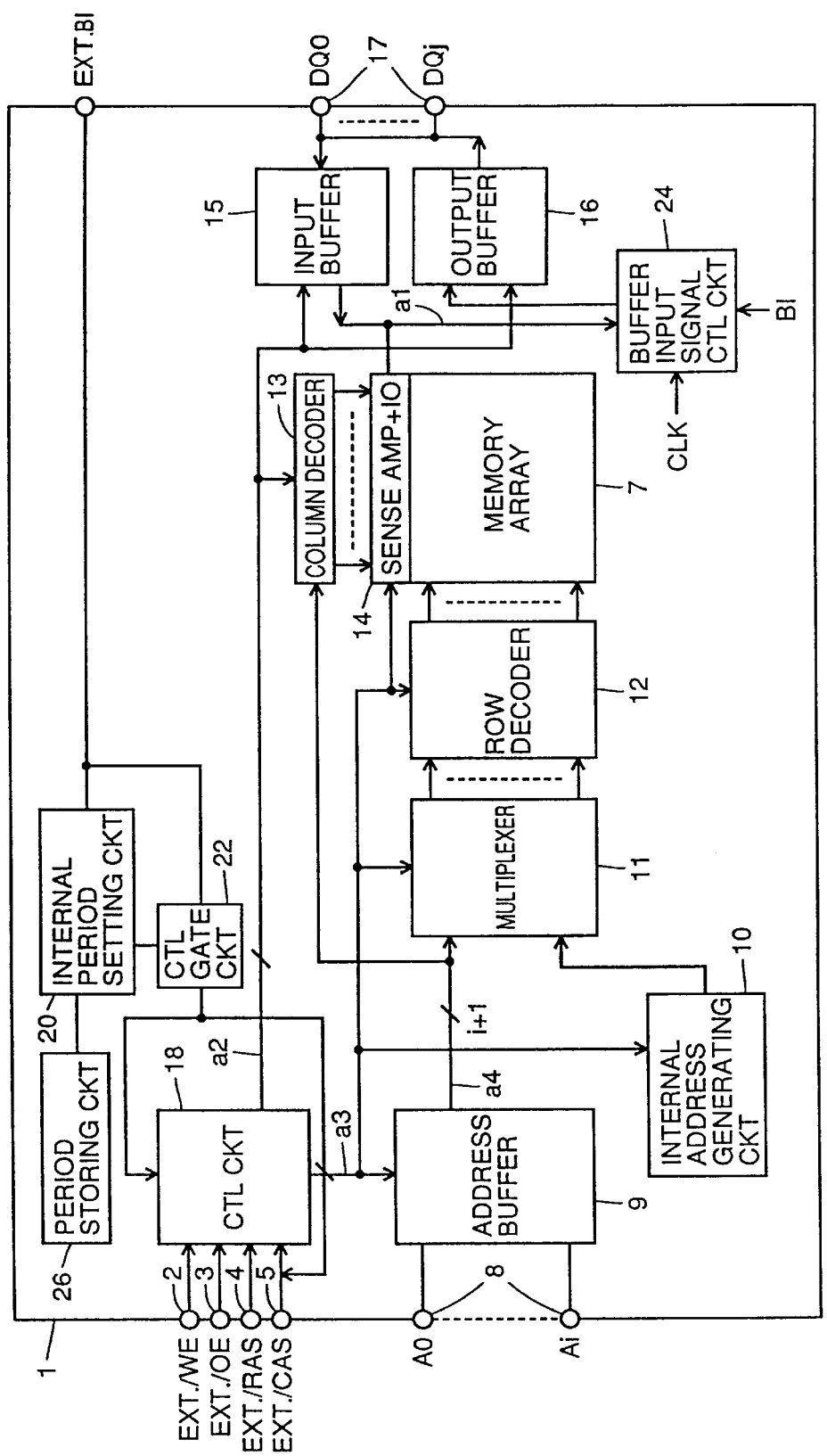
FIG. 6 is a schematic block diagram showing a structure of a semiconductor memory device in accordance with a second embodiment of the present invention.

FIG. 6 is a schematic block diagram showing a structure of semiconductor memory device 1 in accordance with the second embodiment of the present invention.

The present invention differs from the first invention in that the internal clock period control signal FS for controlling the period of internal clock signal St CLK, which is the output from internal period setting circuit 20 is applied not externally but from a period setting circuit 26 which can store, in non-volatile manner, the value of the signal FS.

Figure 7:
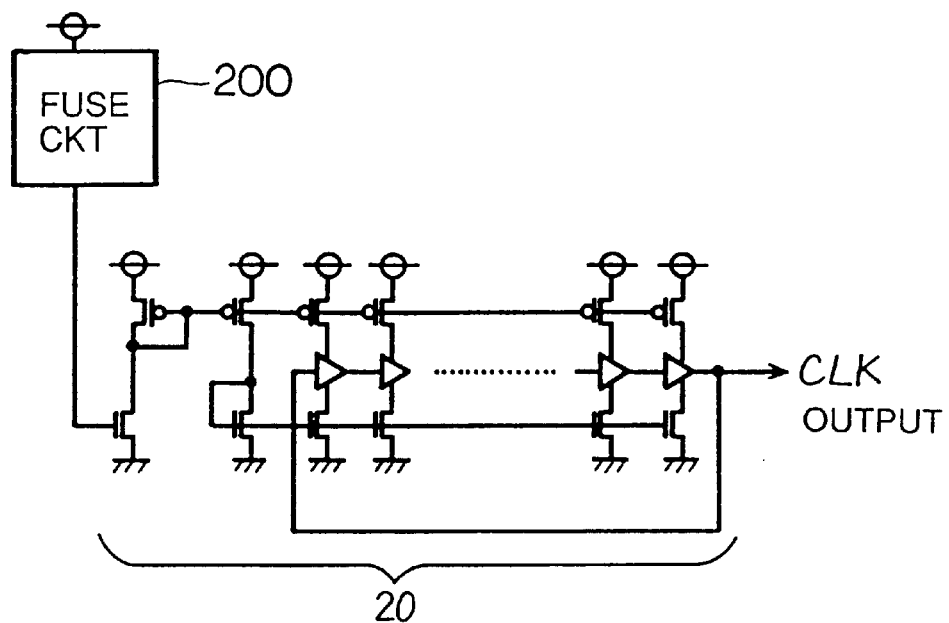
FIG. 7 is a schematic block diagram showing a structure of an internal period setting circuit and of a period storing circuit in accordance with the second embodiment of the present invention.

FIG. 7 is a schematic block diagram showing connection to the period setting circuit 26 and to the internal period setting circuit 25b shown in FIG. 3.

To the gate of N channel MOS transistor 103 in bias generating circuit 100, an output from period setting circuit 26 is input.

Figure 8:
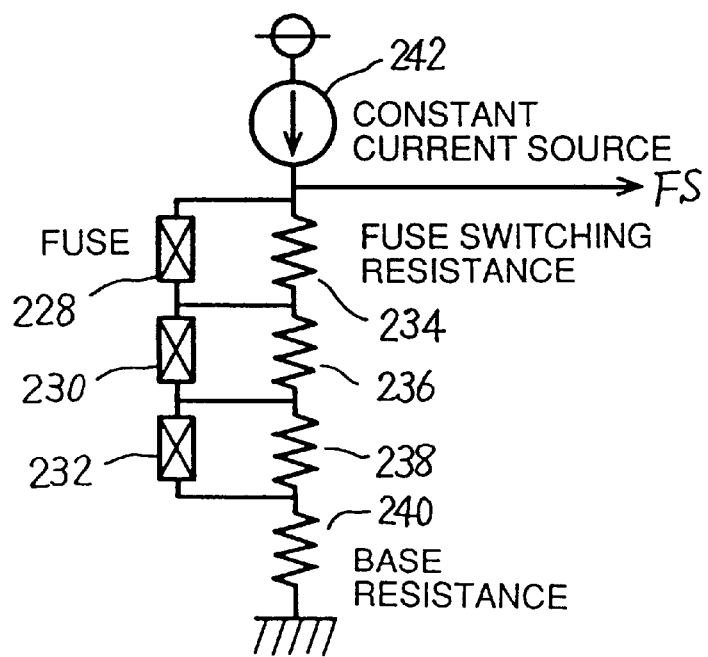
FIG. 8 is a schematic diagram showing a structure of the period storing circuit in accordance with the second embodiment of the present invention.

FIG. 8 shows details of the structure of period setting circuit 26.

Between a constant current source 242 and the ground potential, resistances 234, 236, 238 and 240 are connected in series. A fuse element 228 is connected to resistance 234, fuse element 230 to resistance element 236 and fuse element 232 to resistance 238, parallel to each other. A potential at a node between constant current source 242 and resistance 234 is output as the internal clock period control signal FS.

By blowing fuse elements 228, 230 and 231 by means of laser trimming or the like, the composite value of resistance values of the resistances viewed from the side of the constant current source 242 changes, and hence the value of the internal clock period control signal FS can be changed.

Specifications such as conditions of operation of the semiconductor memory device differ dependent on types. If the design differs, conditions for testing must also be changed. However, according to the present embodiment, the period of the internal clock CLK during the test mode can be flexibly and easily changed corresponding to the types of the semiconductor memory devices.

In the above described embodiment, a method has been described which produces test time for acceleration test such as burn in test by increasing the speed of the period of the internal clock signal CLK as the test condition during test mode period. In order to change acceleration condition in the acceleration test, in addition to the method of increasing the period of the internal clock signal CLK, a method may be used in which the internal power supply voltage Vci which is lowered from the external power supply voltage Vce and supplied to the internal circuitry, is increased to the level of the external power supply voltage.

Figure 9:
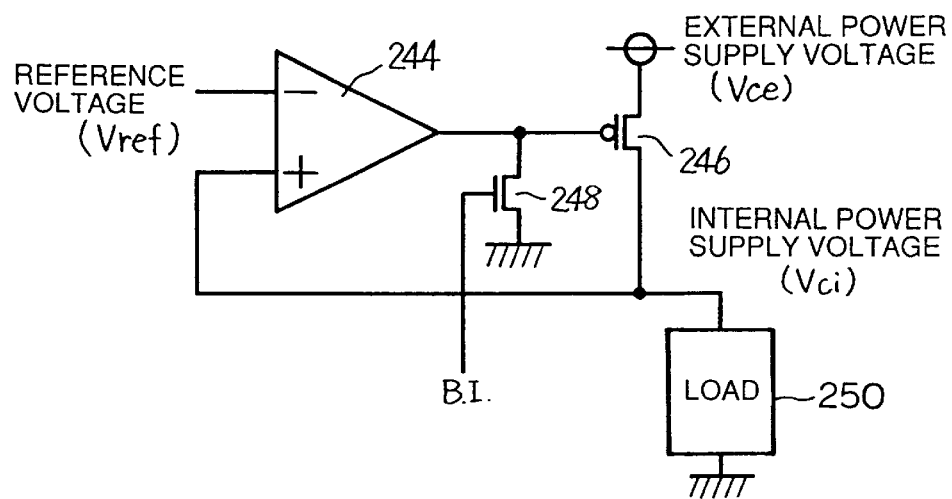
FIG. 9 is a schematic block diagram showing a structure of an internal voltage lowering circuit.

FIG. 9 is a block diagram showing a structure of an internal power supply voltage supplying circuit allowing setting of the above described acceleration condition.

Between the external power supply voltage Vce and the ground potential, P channel MOS transistor 246 and a load 250 are connected in series. To the gate of P channel MOS transistor 246, an output of a differential amplifier 244, which receives as inputs an output Vref from a reference voltage generating circuit (not shown) and a knife power supply voltage Vci, is input. Internal power supply voltage Vci is taken out as the potential at the node between P channel MOS transistor 246 and load 250. The circuit forms a negative feedback loop by the output value of internal power supply voltage Vci, and hence a function of holding the voltage Vci at the reference voltage Vref. Between the output of differential amplifier 244 and the ground potential, an N channel MOS transistor 248 is connected, and its gate potential is controlled by the test mode designating signal EXT.BI. Namely, during the test mode, test mode designating signal EXT.BI attains to the "H" level and N channel MOS transistor 248 is rendered conductive, so that the gate potential of P channel MOS transistor 246 is pulled down to the ground potential. Therefore, P channel MOS transistor 246 is rendered fully conductive, and internal power supply voltage Vci is pulled up to the external power supply voltage Vce.

Figure 10:
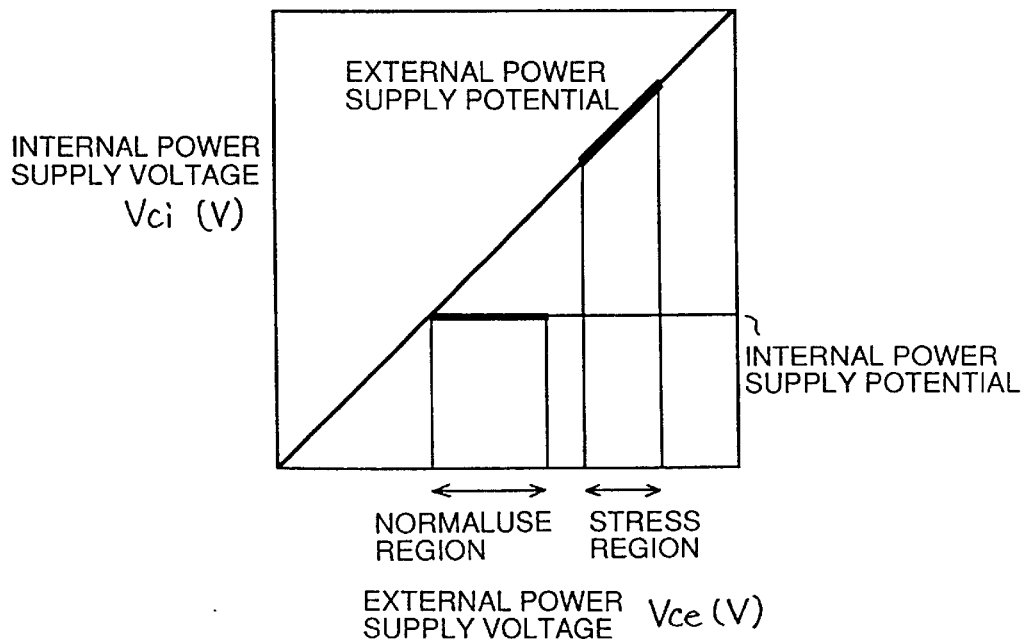
FIG. 10 shows correspondence between an external power supply voltage and an internal power supply voltage during acceleration test.

FIG. 10 shows the difference between the normally used region and acceleration test region, in which the abscissa represents the external power supply voltage and the ordinate represents the internal power supply voltage.

In the normal use region, the internal power supply voltage holds a constant value even when there is fluctuation of the external power supply voltage. However, in the acceleration test region, the internal power supply voltage coincides with the external power supply voltage.

Therefore, the internal circuitry of the semiconductor memory device 1 operates with the external power supply voltage which is higher than in the normal operation, and hence burn in test or the like can be performed under accelerated condition.

Third Embodiment

FIG. 11 is a schematic block diagram showing a structure of semiconductor memory device 1 in accordance with the third embodiment of the present invention.

Different from the first embodiment, the test mode designating signal EXT.BI is not directly applied from the outside but a test mode control circuit 19 is provided which receives external control signals /RAS, /CAS and /WE as well as address signals A0 to Ai and detects designation of the test mode based on the combination of these signals.

In an on-wafer test or the like, it is possible to input a test signal or the like from an external terminal for testing. However, if the semiconductor memory device 1 has already been accommodated in a mold package as a finished product, input of external control signal must be provided through an external pin.

Figure 12:
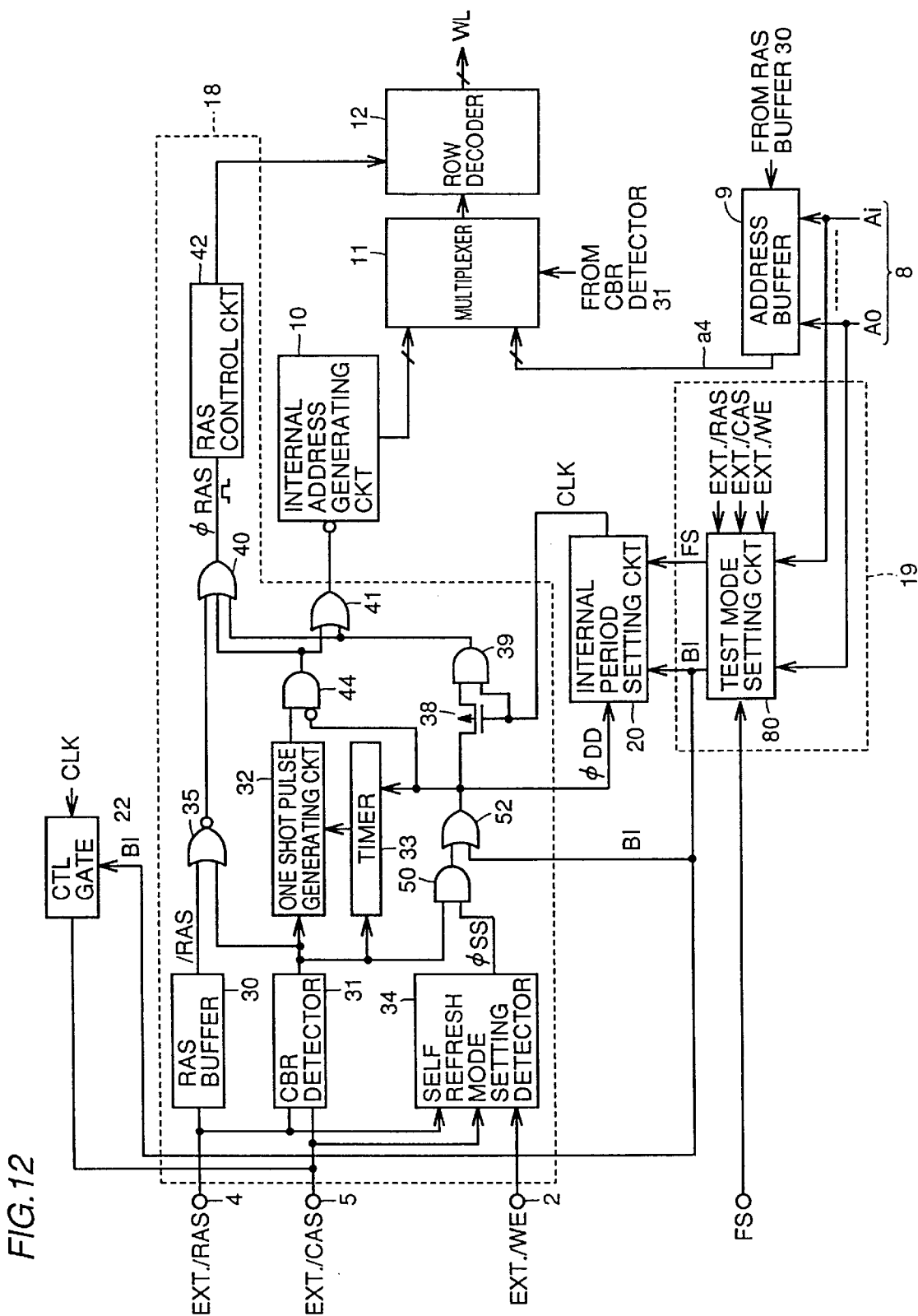
FIG. 12 is a block diagram showing details of a control circuit and a test mode control circuit in accordance with the third embodiment of the present invention.

FIG. 12 shows an example of a specific structure of control circuit 18 and test mode control circuit 19 shown in FIG. 11. Referring to FIG. 12, control circuit 18 includes an RAS buffer 30 receiving external control signal /RAS (EXT./RAS) applied to external control signal input terminal 4 for outputting internal row address strobe signal /RAS; a CBR detecting circuit 31 receiving external control signals EXT./RAS and EXT./CAS applied to external control signal input terminals 4 and 5, respectively, for detecting setting of a CBR condition (in which external control signal EXT./CAS is pulled down to the low level before the fall of the external control signal EXT./RAS); a one shot pulse generating circuit 32 responsive to the CBR detection signal from CBR detector 31 for generating a one shot pulse signal; a timer 33 which is activated in response to the CBR detection signal from CBR detector 31 for applying activating signal to the one shot pulse generating circuit 32 at every prescribed time period while the CBR detecting signal is active; a test mode setting circuit 80 receiving external control signals EXT./WE, EXT./OE, EXT./RAS and EXT./CAS applied to external control signal input terminals 2 to 5 and when these external control signals satisfy a WCBR condition (Write Cas Before Ras condition: EXT./WE is at a high level and CBR condition is satisfied) and prescribed address signal satisfies a super Vcc condition (a potential higher than the Vcc potential, which is the normal high level) is satisfied, indicating that the test mode has been set; and a self-refresh mode setting detecting circuit 34 receiving EXT./RAS, EXT./CAS and EXT./WE for outputting a self-refresh mode designating signal Φss indicating setting of the self-refresh mode when these control signals satisfy a prescribed condition.

One shot pulse generating circuit 32 generates a one shot pulse signal which is kept active for a prescribed time period, in response to activation of the CBR detection signal from CBR detector 31 and to activation of a signal (refresh designating signal) from timer 33.

Control circuit 18 further includes a 2-input NOR gate 35 receiving the internal row address strobe signal /RAS output from RAS buffer 30 and CBR detecting signal output from CBR detector 31; a 2-input AND circuit 50 receiving CBR detection signal output from CBR detector 31 and self-refresh designating signal oss from self-refresh mode setting circuit; a 2-input OR gate 52 receiving an output from AND circuit 50 and test mode designating signal BI from test mode setting circuit 80; a transfer gate 38 responsive to a clock signal CLK from internal period setting circuit 20 for selectively passing the output signal from OR gate 52; a 2-input AND gate 39 receiving the clock signal CLK from internal period setting circuit 20 and the output signal from transfer gate 38; a 2-input AND gate 44 receiving an inverted signal of the output signal from OR gate 52 and the output signal from one shot pulse generating circuit 32; a 3-input OR gate 40 receiving the output signal from NOR gate 35 and output signals from AND gates 39 and 44; a 2-input OR gate 41 receiving the output signal from AND gate 44 and the output signal from AND gate 39; and an RAS control circuit 42 for activating circuits related to row selecting operations at a prescribed timing, in response to the output signal ΦRAS from OR gate 40. In FIG. 12, RAS control circuit 42 controls activation/inactivation of row decoder 12.

NOR gate 35 outputs a high level signal when the signal /RAS from RAS buffer 30 is at the low level and the output signal from CBR detector 31 is at the low level. More specifically, in the normal operation (when CBR condition is not set), the NOR gate inverts and outputs the signal from RAS buffer 30. When the CBR condition is set, NOR gate 35 is set to the inactive state of low level, regardless of the logic level of the output signal from RAS buffer 30. Therefore, when the CBR condition is set, the row selecting operation by the control of external control signal EXT./RAS is inhibited.

AND gate 50 outputs an active signal of high level, when the CBR detection signal from CBR detector 31 is at the active state of high level, and the self-refresh mode designating signal Φss from self-refresh mode setting circuit 34 is at the active state of high level. OR gate 52 outputs an active signal of high level when the output. from AND gate 52 is at the high level or when the test mode designating signal BI from test mode setting circuit 80 is the active state of high level. Namely, OR gate 52 outputs an active signal of high level only when the self-refresh mode or the test operation mode is designated and the word lines are to be successively selected.

Transfer gate 38 is formed, for example, of a P channel MOS transistor, and it is rendered conductive when the clock signal CLK from internal period setting circuit 20 is at the low level. Therefore, even when the clock signal CLK is at the high level when termination of the test mode is designated, the clock signal CLK is prevented from immediately falling to the low level. The test mode operation is completed after the fall of the clock signal CLK to the low level. Thus destruction of memory cell data caused by inappropriate word line selection can be prevented. Therefore, the transfer gate 38 has a function of a latch circuit latching the output signal from AND gate 37 at every rise of the clock signal CLK.

OR gate 40 outputs a word line selecting operation activating signal (internal RAS signal) ΦRAS which attains to the active state of high level when the output signal from AND gate 39, the output signal from AND gate 44 or the output signal from NOR gate 35 is set to the high level. The signal ΦRAS is applied to RAS control circuit 42. In FIG. 12, the RAS control circuit 42 is shown to control only the row decoder 12. However, it also controls operations of other sense amplifier circuits, bit line equalizing/precharging circuit (not shown) and so on.

The output signal from OR gate 41 is applied to the internal address generating circuit 10. Internal address generating circuit 10 increments or decrements the address value indicated by the address signal output therefrom at every fall of the output signal from OR circuit 41.

Therefore, in the semiconductor memory device 1 controlled by the control circuit 18 having the above described structure, when self-refresh mode or test mode is designated by the external control signals and the address signals A0 to Ai, word lines are selected successively by the internal clock signal CLK which is the output signal from internal period setting circuit 20, and refreshing operation of the memory cells belonging to the row designated by the internal address generating circuit 10 is performed.

In FIG. 12, the internal clock period control signal FS is adapted to be applied from a specific control pin, in order to externally control the period of the internal clock signal CLK which is the output signal from internal period setting circuit 20. However, the value of the internal clock period control signal may be set by the test mode setting circuit 80 based on the combination of prescribed address signals A0 to Ai and it may be output to the internal period setting circuit 20.

Fourth Embodiment

Figure 13:
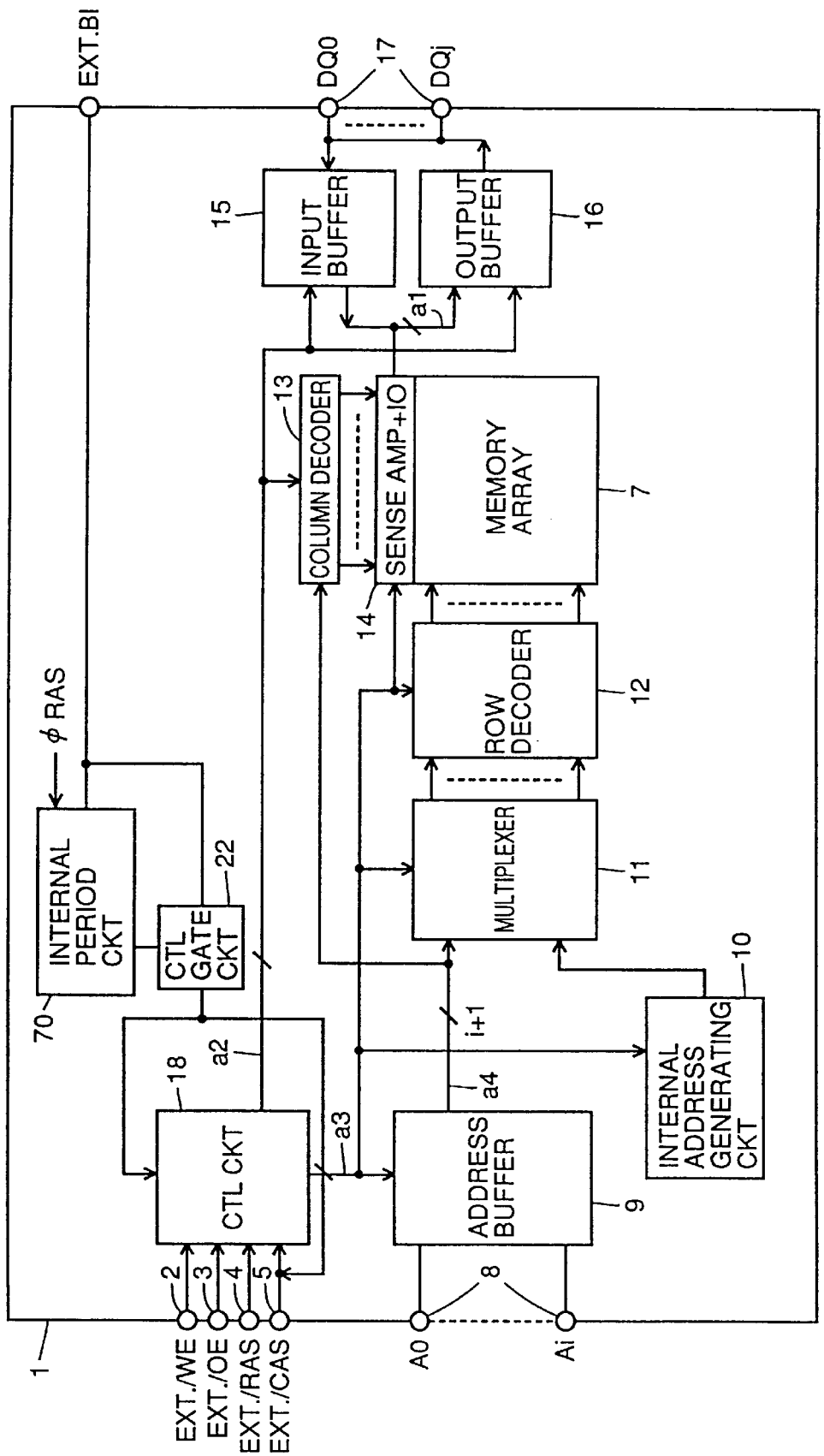
FIG. 13 is a schematic block diagram showing a structure of a semiconductor memory device in accordance with a fourth embodiment of the present invention.

FIG. 13 is a schematic block diagram showing a structure of the semiconductor memory device 1 in accordance with the fourth embodiment of the present invention.

The present embodiment differs from the first embodiment in that an internal period circuit 70 is provided which receives, when the test mode is designated by the test mode designating signal EXT.BI, an internal row strobe address signal øRAS generated corresponding to an externally applied external clock signal, for example, the external row strobe signal EXT./RAS and generates an internal clock signal CLK synchronized therewith is provided.

As already described with respect to the prior art, when a plurality of semiconductor memory devices are to be tested in parallel, the externally applied external clock signal has its waveform distorted because of signal propagation delay on the test board. In the present embodiment, an internal clock signal synchronized with the external clock signal is generated by the internal synchronizing circuit 70 in order to shape the waveform of the internal clock signal controlling the operation of the internal circuitry of the semiconductor memory device 1.

Internal row strobe signal ΦRAS is assumed to be an internal signal derived from the external row strobe signal EXT./RAS passed through the RAS buffer circuit 30, as in the control circuit 18 shown in FIG. 12.

The internal synchronizing circuit 70 may have a structure of a phase locked loop circuit (PLL circuit) or a delay locked loop circuit (DLL circuit).

Figure 14:
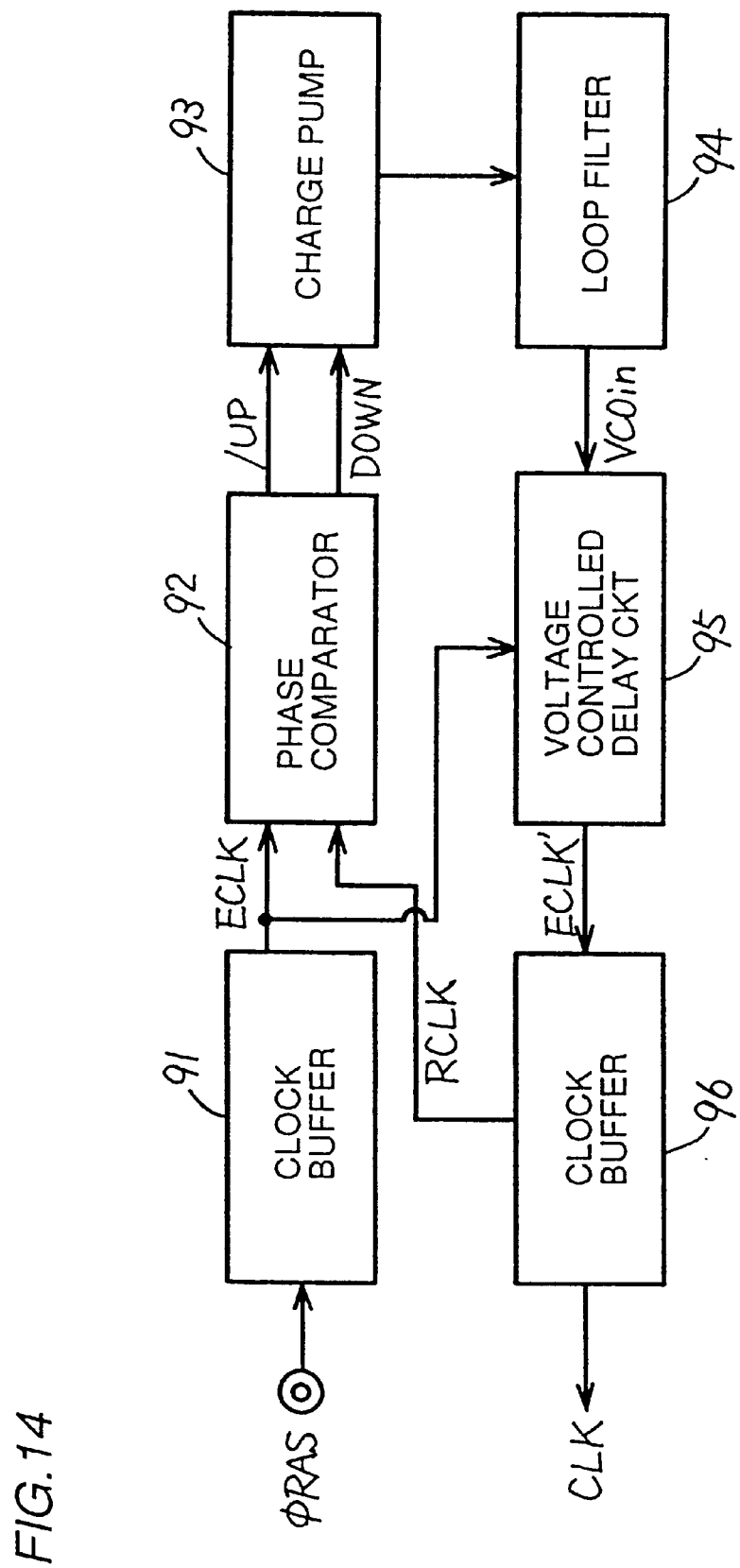
FIG. 14 is a schematic block diagram showing a structure of an internal synchronizing circuit in accordance with the fourth embodiment of the present invention.

FIG. 14 is a schematic block diagram showing a structure in which a DLL circuit is used as the internal synchronizing circuit 70.

Referring to FIG. 14, the DLL circuit includes clock buffers 91 and 96, a phase comparator 92, a charge pump circuit 93, a loop filter 94 and a voltage controlled delay circuit 95.

Figure 15:
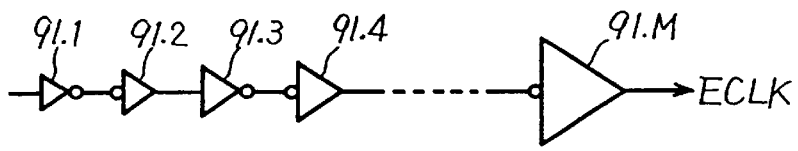
FIG. 15 is a partially omitted circuit diagram showing a structure of a clock buffer 91 shown in FIG. 14.

Clock buffer 91 includes, as shown in FIG. 15, M (M is a positive integer) inverters 91.1 to 91.M connected in series, amplifies the external clock signal øRAS and outputs a clock signal ECLK. Clock signal ECLK is applied to phase comparator 92 and voltage controlled delay circuit 95. The size of the symbol of the inverters 91.1 to 91.M represents the load driving capability of each of the inverters 91.1 to 91.M, and the load driving capability of inverters 91.1 to 91.M gradually increases toward the output end. The load driving capability of inverters 91.2 to 91.M of the succeeding stages are set to be third times or fourth times that of the load driving capability of inverters 91.1 to 91.M-1 of the preceding stages.

The number M of inverters 91.1 to 91.M is set in accordance with the capacity of phase comparator 92 and of voltage controlled delay circuit 95.

Figure 16:
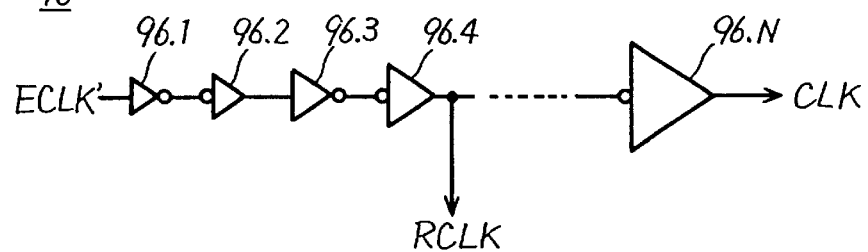
FIG. 16 is a partially omitted circuit diagram showing a structure of a clock buffer 96 shown in FIG. 14.

Clock buffer 96 includes N (N is a positive integer) inverters 96.1 to 96.N connected in series, amplifies the output ECLK' from voltage controlled delay circuit 95 and outputs internal clock signals CLK and RCLK, as shown in FIG. 16. Internal clock signal CLK is supplied to control gate circuit 22 as in the first embodiment. Clock signal RCLK is applied to phase comparator 92. Load driving capability of inverters 96.1 to 96.N constituting clock buffer 96 is also increased gradually toward the output end, as in the clock buffer 90. The number N of the inverters 96.1 to 96.N is set in accordance with the load capacitance. The inverter (in the figure, 96.4) outputting the clock signal RCLK is selected such that phase difference between the external clock signal ERAS and internal clock signal CLK has a prescribed value.

Figure 17:
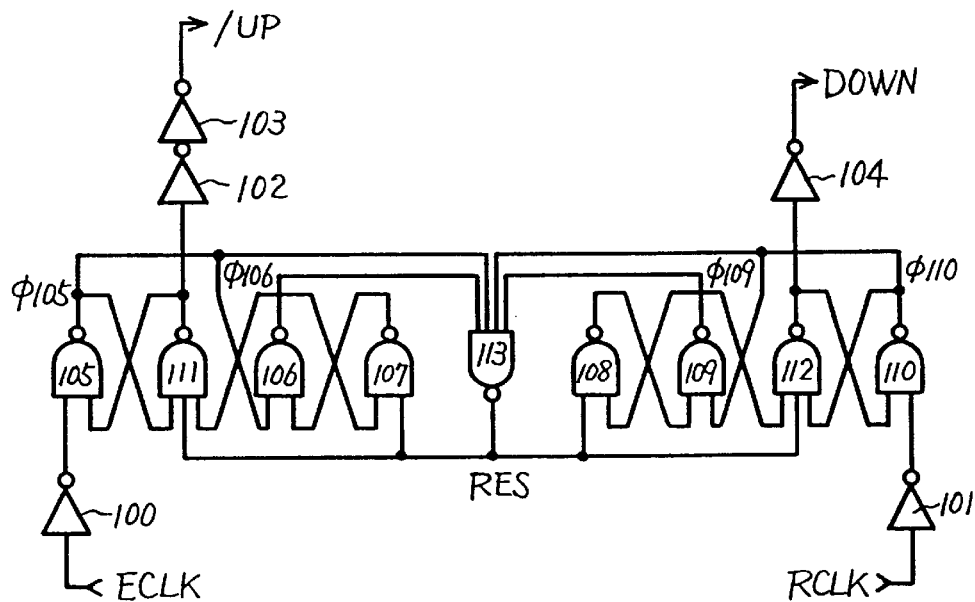
FIG. 17 is a schematic diagram showing a structure of a phase comparator shown in FIG. 14.

Phase comparator 92 shown in FIG. 14 will be described. FIG. 17 is a circuit diagram showing the structure of phase comparator 92. Referring to the figure, phase comparator 92 includes inverters 300 to 304, 2-input NAND gates 305 to 310, a 3-input NAND gate 311 and 312, and a 4-input NAND gate 313.

Inverters 300 receives clock signal ECLK from clock buffer 91. Inverter 301 includes clock signal RCLK from clock buffer 96. NAND gate 305 receives an output from inverter 300 and an output from AND gate 311, and provides a signal ø305. NAND gate 306 receives outputs from NAND gates 305 and 307 and provides a signal ø306. NAND gate 307 receives outputs from NAND gates 306 and 313, and NAND gate 308 receives outputs from NAND gates 309 and 313. 5 NAND gate 309 receives outputs from NAND gates 308 and 310, and provides a signal ø309. NAND gate 310 receives an output from inverter 301 and an output from NAND gate 312, and provides a signal ø310.

NAND gate 313 receives signals ø305, ø306, ø309 and ø310 from NAND gates 305, 306, 309 and 310, and outputs a reset signal RES. NAND gate 311 receives signals ø305, ø306 and RES from NAND gates 305, 306 and 313, and provides an up signal /UP through inverters 302 and 303. NAND gate 312 receives signals ø309, ø310 and RES from AND gates 309, 310 and 313, and provides a down signal DOWN through inverters 304.

Figure 18:
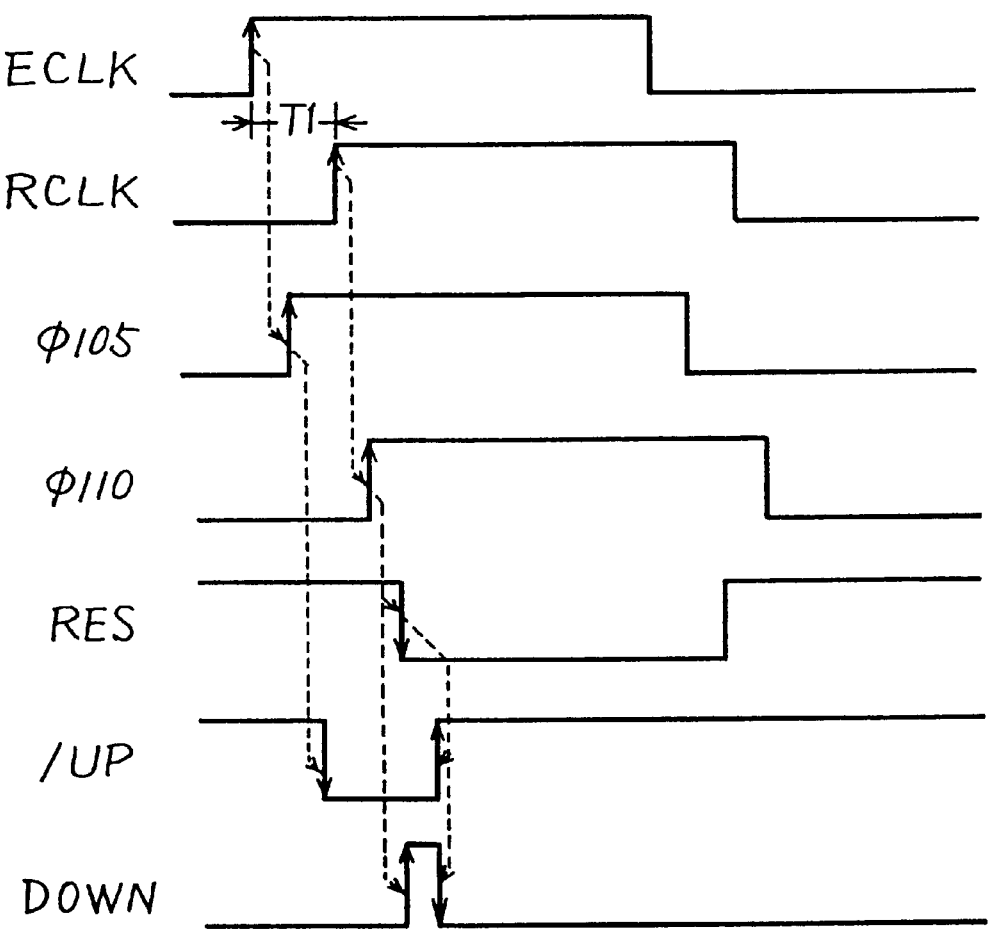
FIG. 18 is a timing chart showing an operation of the phase comparator 92 shown in FIG. 14.

FIG. 18 is a timing chart showing relationship between each of clock signal ECLK, clock signal RCLK, the output from 2-input NAND gate 305 (signal ø305), the output from 2-input NAND gate 310 (signal ø310) the output from 4-input NAND gate 313 (reset signal RES), up signal /UP and down signal DOWN.

Prior to the description of FIGS. 17 and 18, assume that the clock signals ECLK and RCLK are both at the "H" level. In that case, gates 305 and 310 provide "H" level, without fail. If the output from gates 306 and 309 are at the "H" level, the output from gate 313 attains to "L" level, the outputs from gates 307 and 308 attain to the "H" level, and as a result, the output from gates 306 and 309 attain to the "L" level. Therefore, as long as the clock signals ECLK and RCLK are both at "H" level, gates 311 and 312 always output "H" level. After such a state, when the clock signals ECLK and RCLK are changed to the "L" level, the outputs from gates 305 and 310 attain to the "L" level, and gates 306 and 309 outputs "H" level.

Thereafter, let us assume that the clock signal ECLK rises first and then clock signal RCLK rises delayed by the phase T1, as shown in FIG. 18. In response to the rise of clock signal ECLK, the output ø305 of gate 305 attains to the "H" level. However, as the clock signal RCLK remains "L" level, the output ø310 of gate 310 maintains the "L" level, and the output RES of gate 313 is not changed but maintained at "H" level. Therefore, the output from gate 311 changes to the "L" level. Meanwhile, the output from gate 312 is kept at the "H" level.

When the clock signal RCLK rises thereafter, the output ø310 of gate 310 changes to the "H" level, four inputs to the gate 313 all attain "H" level, and the output RES from gate 313 changes to the "L" level. As a result, the output from gate 311 again changes from "L" level to the "H" level, and gate 311 provides a pulse signal reflecting the phase difference between clock signal ECLK and clock signal RCLK.

Meanwhile, the output from gate 312 changes to the "L" level, in response to the change of the output from gate 310 to the "H" level. However, as the output of gate 313 changes to the "L" level immediately thereafter, it quickly returns to the "H" level. Therefore, gate 312 outputs a pulse signal of a constant width not related to the phase difference between the clock signals ECLK and RCLK.

When the clock signal RCLK falls first and the clock signal ECLK rises thereafter, the relation between the up signal /UP and down signal DOWN is reversed. Except this point, the operation is the same, and therefore description thereof is not repeated.

Figure 19:
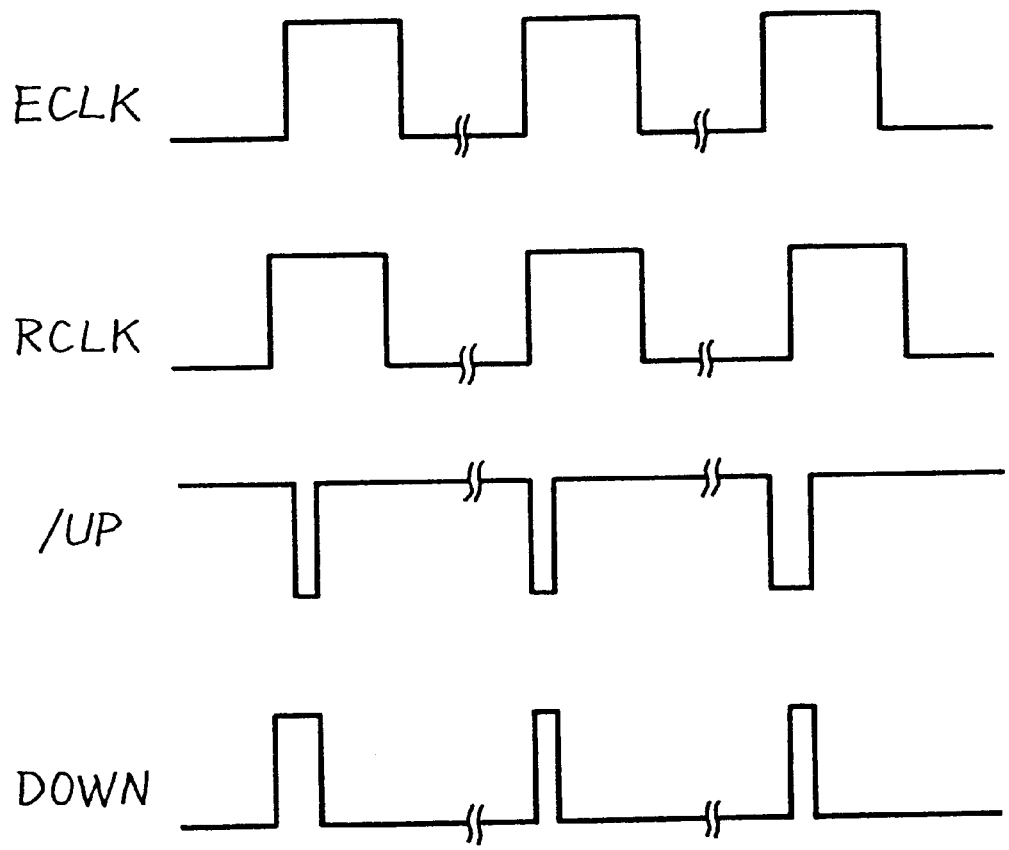
FIG. 19 is another time chart showing an operation of the phase comparator 92 shown in FIG. 14.

More specifically, as shown in FIG. 19, when the phase of clock signal ECLK is delayed from that of clock signal CLK, phase comparator 92 provides an up signal /UP having a prescribed pulse width and a down signal DOWN having a pulse width corresponding to the phase difference, when the phases of clock signals ECLK and RCLK match each other, it provides signals /UP and DOWN having the same pulse width, and when the phase of clock signal ECLK is advanced than the clock signal RCLK, it provides the down signal DOWN having a prescribed pulse width and the up signal /UP having the pulse width corresponding to the phase difference.

Figure 20:
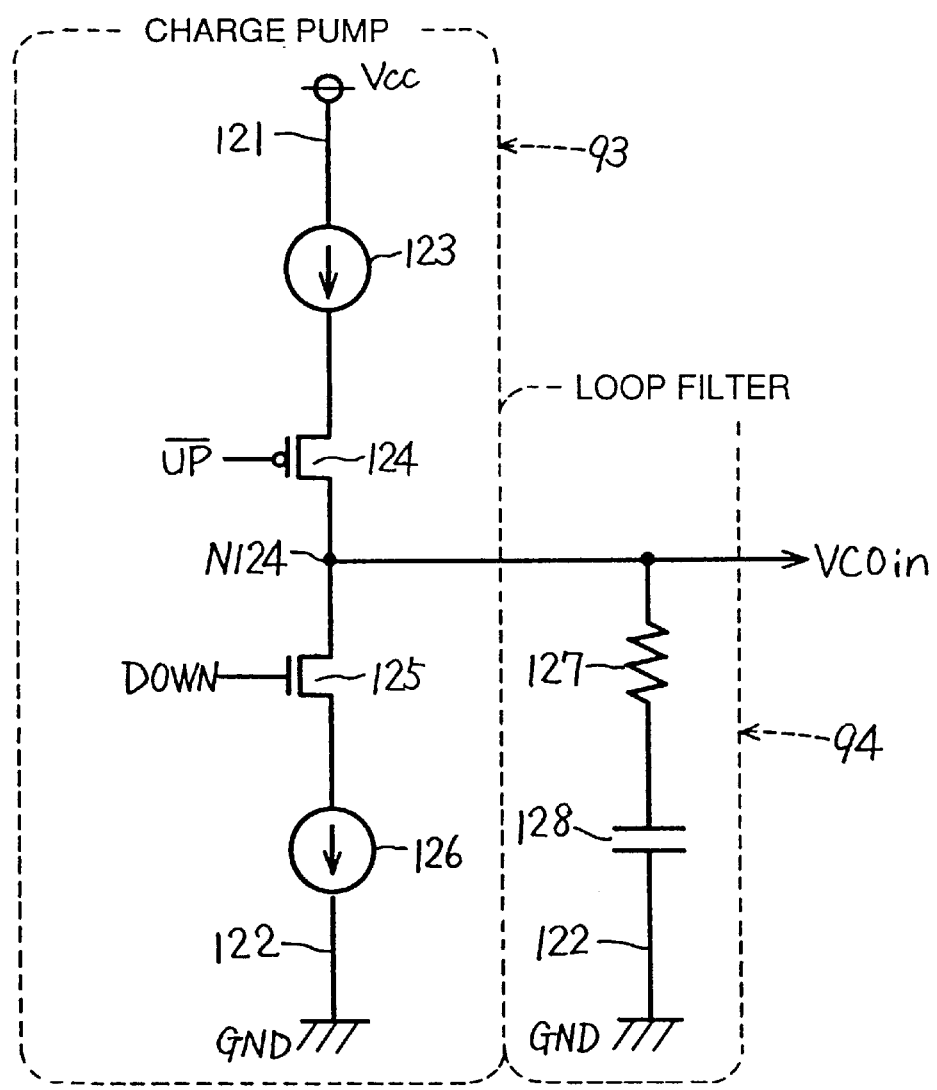
FIG. 20 is a schematic diagram showing structures of a charge pump 93 and a loop filter 94 shown in FIG. 14.

FIG. 20 is a circuit diagram showing a structure of charge pump 93 and loop filter 94 shown in FIG. 14. Referring to FIG. 20, charge pump 93 includes a constant current source 123, a P channel MOS transistor 124, an N channel MOS transistor 125 and a constant current source 126 connected in series between power supply potential line 121 and ground potential line 122.

P channel MOS transistor 124 receives at its gate the up signal /UP, and N channel MOS transistor 125 receives at its gate the down signal DOWN. The connection node N 124 between P channel MOS transistor 124 and N channel MOS transistor 125 serves as an output node of charge pump 93. Loop filter 94 includes a resistance 127 and capacitor 12 connected in series between output node N124 and ground potential line 122.

The operation of charge pump 93 and loop filter 94 shown in FIG. 20 will be described. When the up signal /UP and down signal DOWN both attain to the "L" level, P channel MOS transistor 124 is rendered conductive, N channel MOS transistor 125 is rendered non-conductive, and charges are supplied to capacitor 127 through power supply line 122→constant current source 123→P channel MOS transistor 124→node N124→resistance 127. Thus, the voltage at node N124, that is, the control voltage VCOin gradually rises.

Conversely, when the up signal /UP and down signal DOWN both attain to the "H" level, P channel MOS transistor 124 is rendered non-conductive, N channel MOS transistor 125 is rendered conductive, and charges in capacitor 128 flows out through capacitor 128→resistance 127→node N124→N channel MOS transistor 125→constant current source 126→ground potential line 122. Therefore, control voltage VCOin lowers gradually.

When up signal /UP attains to the "L" level and down signal DOWN attains to the "H" level, MOS transistors 120 and 125 are both rendered conductive, the amount of charges flowing to node 124 becomes equal to the amount of charges flowing out from node N124, and hence control voltage VCOin is not changed.

When the up signal /UP attains to the "H" level and down signal DOWN attains to the "L" level, MOS transistors 124 and 125 are both rendered non-conductive, node N124 is set to the floating state and control voltage VCOin does not change.

More specifically, when the clock signal ECLK has its phase delayed from clock signal RCLK, the control voltage VCOin, which is the output from charge pump 93 and loop filter 94 lowers gradually, when the clock signals ECLK and RCLK have their phases matching, the control voltage does not change, and if the phase of the clock signal ECLK is advanced than that of clock signal RCLK, it increases gradually.

Figure 21:
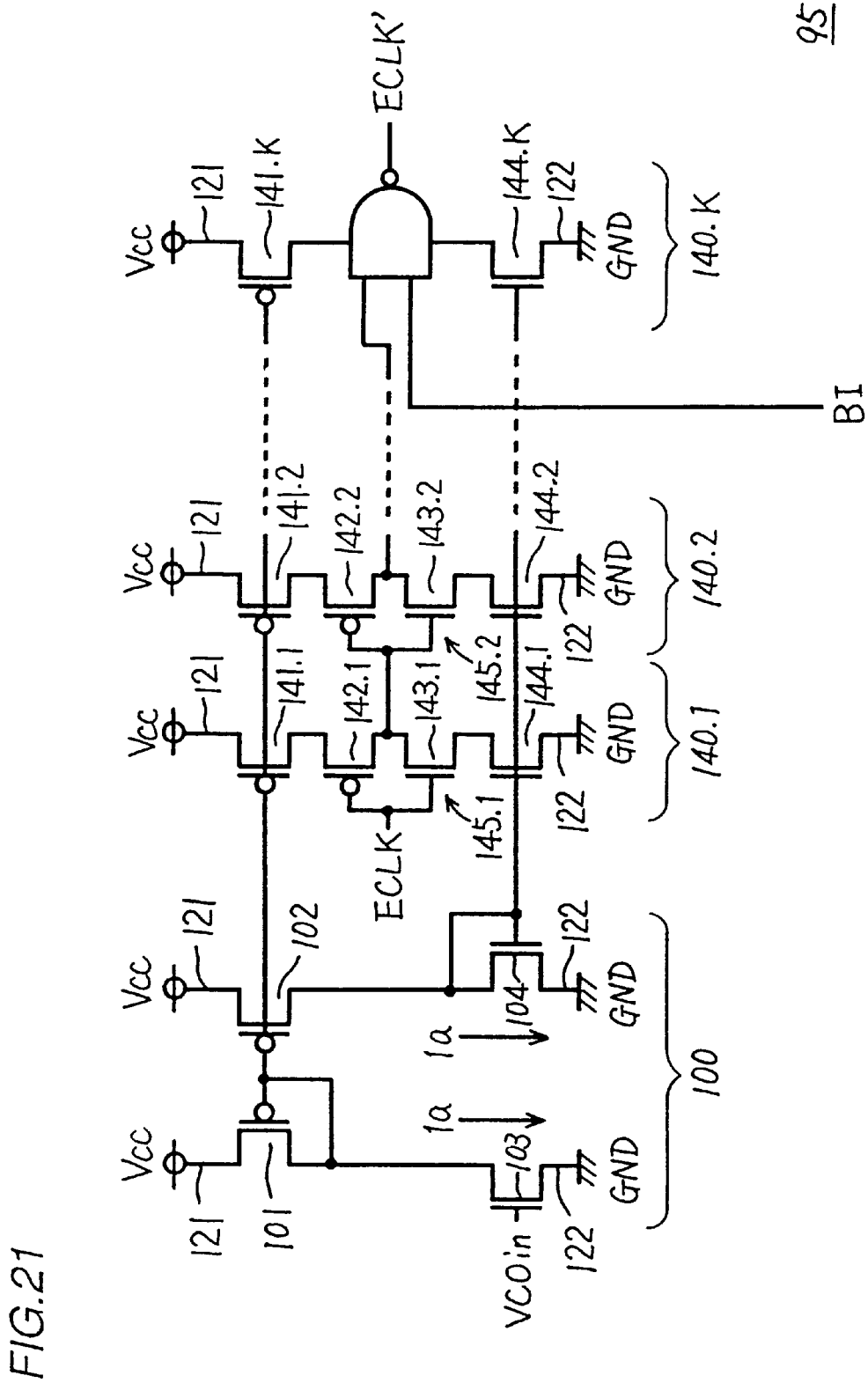
FIG. 21 is a partially omitted circuit diagram showing a structure of a voltage controlled delay circuit shown in FIG. 14.
Figure 22:
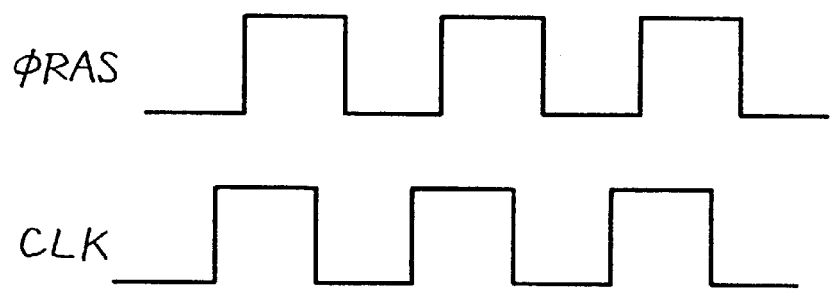
FIG. 22 is a timing chart showing an operation of a DLL circuit shown in FIG. 14.

FIG. 21 is a partially omitted circuit diagram showing a structure of the voltage controlled delay circuit 95 shown in FIG. 14.

The circuit structure is basically the same as that of internal period setting circuit 20b described with reference to FIG. 3. Therefore, details of the structure and operation are not repeated, and only the difference will be described in the following.

More specifically, corresponding to the internal clock period control signal FS applied externally to control oscillating frequency of the internal period setting circuit 20b in FIG. 3, the output voltage VCOin from charge pump circuit 93 and loop filter 94 is input to the gate of N channel MOS transistor 101.

Meanwhile, in the internal period setting circuit 20b, the output from NAND circuit 141.K is connected to the input of inverter 145.1 in order to perform oscillating operation. In the voltage controlled delay circuit 95, the clock signal ECLK is input to the input of inverter 145.1, and the output from NAND circuit 141.K is taken out as the clock signal ECLK'.

Therefore, the operation of voltage controlled delay circuit 95 is as follows.

As the gates of P channel MOS transistors 141.1 to 141.K are both connected to the gate of P channel MOS transistor 102 and the gates of N channel MOS transistors 144.1 to 144.K are connected to the gate of N channel MOS transistor 104, the current Ia flowing through N channel MOS transistors 101 and 104 also flows through each of the delay time variable elements 140.1 to 140.K, in accordance with the control voltage VCOin.

When the current Ia increases as the control voltage VCOin rises, the time for inversion of each of the inverters 145.1 to 145.K-1 and of NAND circuit 145.K becomes shorter and delay time of the voltage controlled delay time 95 becomes shorter.

When the control voltage VCOin reduces and the current Ia reduces, the time for inversion of each of the inverters 145.1 to 145.K-1 and of NAND circuit 145.K becomes longer, and the delay time of voltage controlled delay circuit 95 becomes longer.

Based on the operation of each structural block described above, the operation of the DLL circuit shown in FIG. 14 will be described. When the phase of the clock signal RCLK is delayed from the clock signal ECLK, phase comparator 92 provides the up signal /UP having the pulse width corresponding to the phase difference between clock signals ECLK and RCLK, and the down signal DOWN having a prescribed pulse width. Accordingly, charge pump 93 supplies charges to loop filter 94, control voltage VCOin increases accordingly, and the delay time of voltage controlled delay circuit 95 becomes shorter. Therefore, the phase of the clock signal RCLK advances, and the phase difference between the clock signals ECLK and RCLK becomes smaller.

Conversely, when the phase of clock signal RCLK is advanced from clock signal ECLK, the phase comparator 92 provides the down signal DOWN having the pulse width corresponding to the phase difference between clock signals RCLK and ECLK, and the up signal /UP having a prescribed pulse width. Accordingly, charges flow out from the loop filter 94 to the charge pump 93, so that control voltage VCOin lowers and the delay time of voltage control delay circuit 95 becomes longer. Thus the phase of the clock signal RCLK is delayed, and the phase difference between clock signals RCLK and ECLK becomes smaller. By the repetition of such process, the phase difference between clock signals RCLK and ECLK is eliminated.

Figure 23:
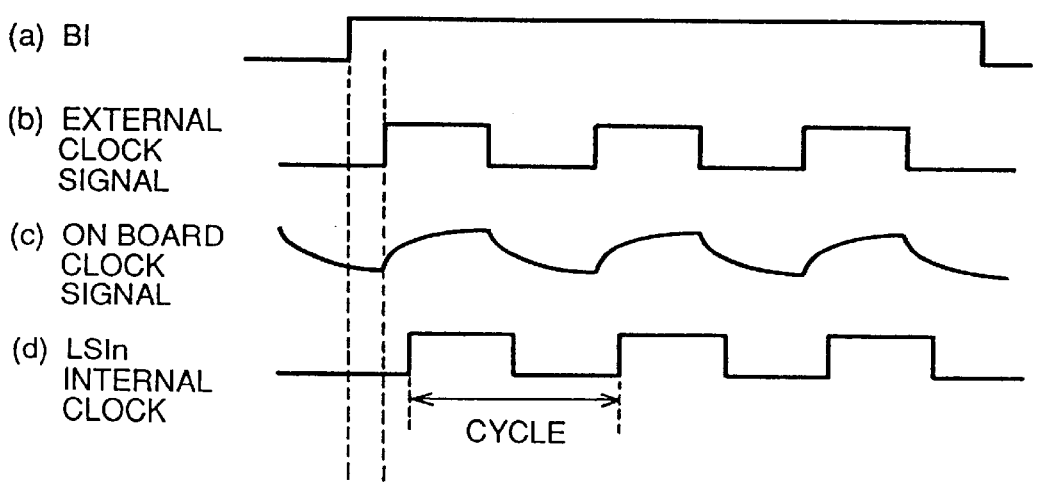
FIG. 23 is a timing chart showing an operation of the fourth embodiment of the present invention.

FIG. 23 is a timing chart showing the operation of semiconductor memory device 1 having an internal synchronizing circuit 70 performing the above described operation.

When a plurality of semiconductor memory devices 1 are arranged on a test board, the externally applied clock signal EXT.CLK has its waveform distorted as shown in FIG. 23, because of the signal propagation delay.

However, when the test mode designating signal EXT.BI attains to the "H" level and internal synchronizing circuit 70 starts its operation, the internal clock signal CLK output from the circuit comes to have a rectangular shape which is synchronized with the external clock signal.

Therefore, even when the external clock signal has distorted waveform on the board, it does not affect the circuit operation in the semiconductor memory device.

Fifth Embodiment

Figure 24:
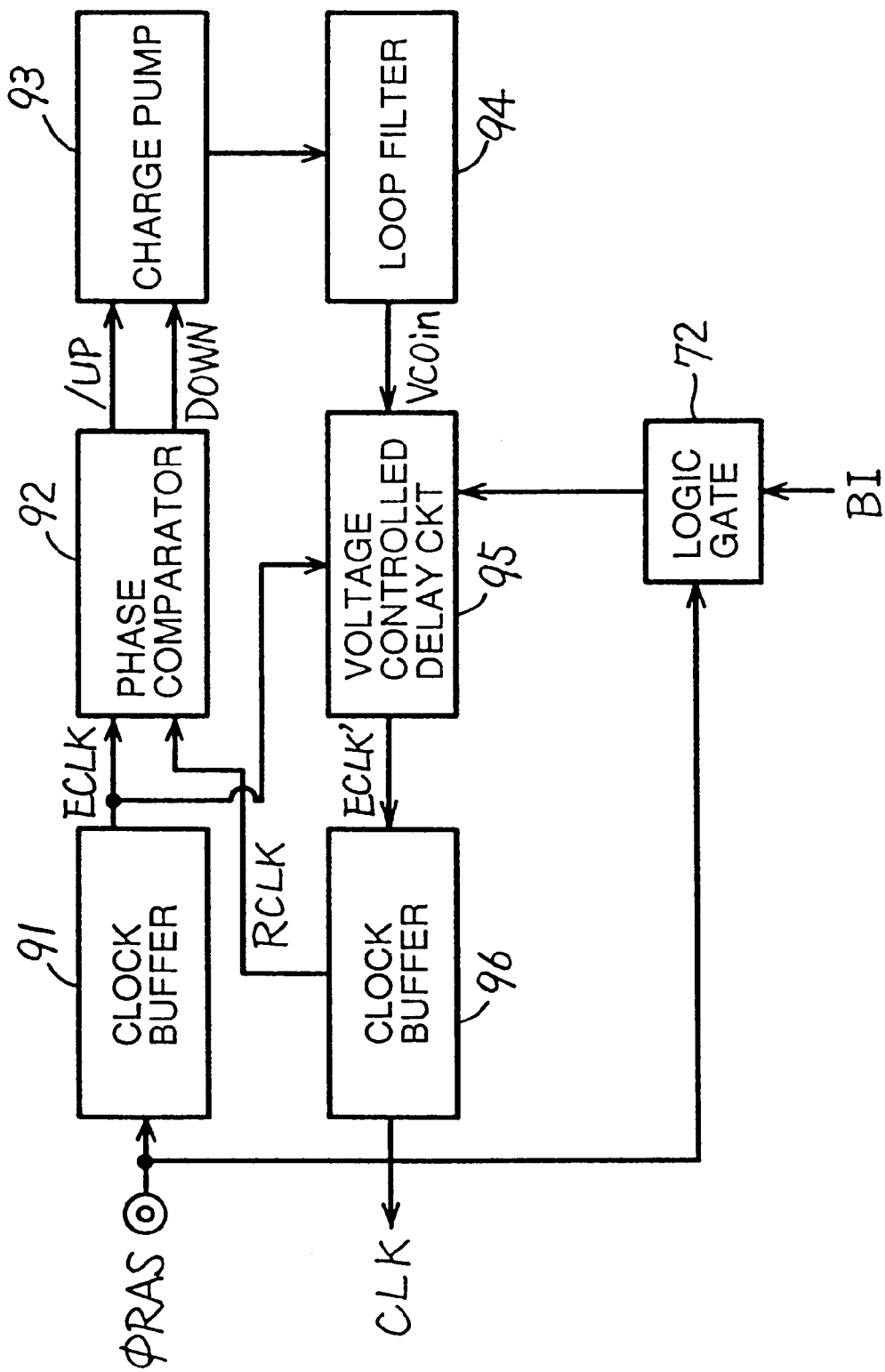
FIG. 24 is a schematic block diagram showing a structure of an internal synchronizing circuit 70 in accordance with a fifth embodiment of the present invention.

FIG. 24 is a block diagram showing a structure of the internal-synchronizing circuit 70 in semiconductor memory device 1 in accordance with the fifth embodiment. After the test mode designating signal EXT.BI attains to the "H" level, the output of internal clock signal CLK must be started in response to the first rise of the external clock signal EXT.CLK. The reason for this is that it is necessary to prevent the destruction of memory cell data caused by inappropriate word line selecting operation, and that when there is large phase difference from the external clock, the time necessary for the phase to be matched with the external clock differ in each semiconductor memory device 1, as the internal timer starts oscillation arbitrarily.

In the third embodiment shown in FIG. 12, the test mode is designated by the test mode designating signal by the latching operation of transfer gate 38 and AND gate 39, the internal clock signal CAL is output after the rise of the first oscillating waveform. The above described problem can be solved by the similar structure in the present embodiment also.

Alternatively, as shown in FIG. 24, it is possible to start the operation of voltage controlled delay circuit 95 by a logic circuit 72 detecting the rising edge of the first external clock signal, after the test mode designating signal attains to the "H" level.

Figure 25:
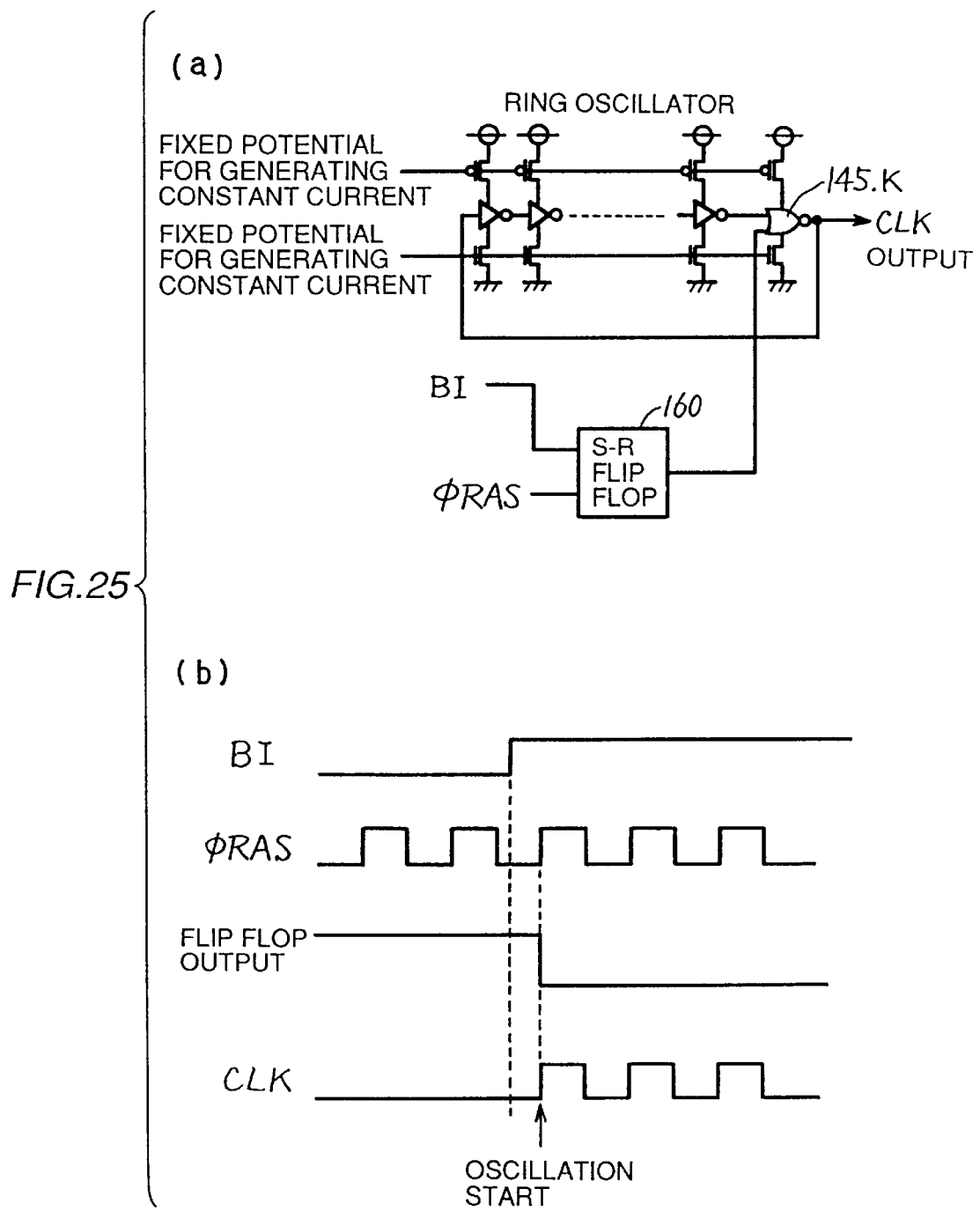
FIG. 25 shows structure and operation of the fifth embodiment of the present invention in which (a) is a schematic block diagram showing the structure of the fifth embodiment, and (b) is a timing chart showing the operation of the fifth embodiment.

FIG. 25(a) is a schematic diagram showing an example of the structure of logic circuit 72.

It is different from the voltage, controlled delay circuit shown in FIG. 21 in that the variable delay element NAND circuit 145.K of the last stage is changed to an NOR circuit 145.K, which receives at one input an output from an S-R flip-flop circuit 160 which in turn receives the test mode designating signal EXT.BI and the external clock signal EXT.CLK, and receives at another input, the output from inverter 145.K-1.

When the test mode designating signal EXT.BI attains to the "H" level, and then the external clock signal EXT.CLK first attains to the "H" level, the output from S-R flip-flop circuit 160 changes from the "H" level to the "L" level. Therefore, the voltage controlled delay circuit 95 starts its operation in response to the rise of the first external clock signal EXT.CLK after the test mode is entered.

By the above described circuit structure, occurrence of inappropriate word line selecting operation can be prevented.

Sixth Embodiment

Figure 26:
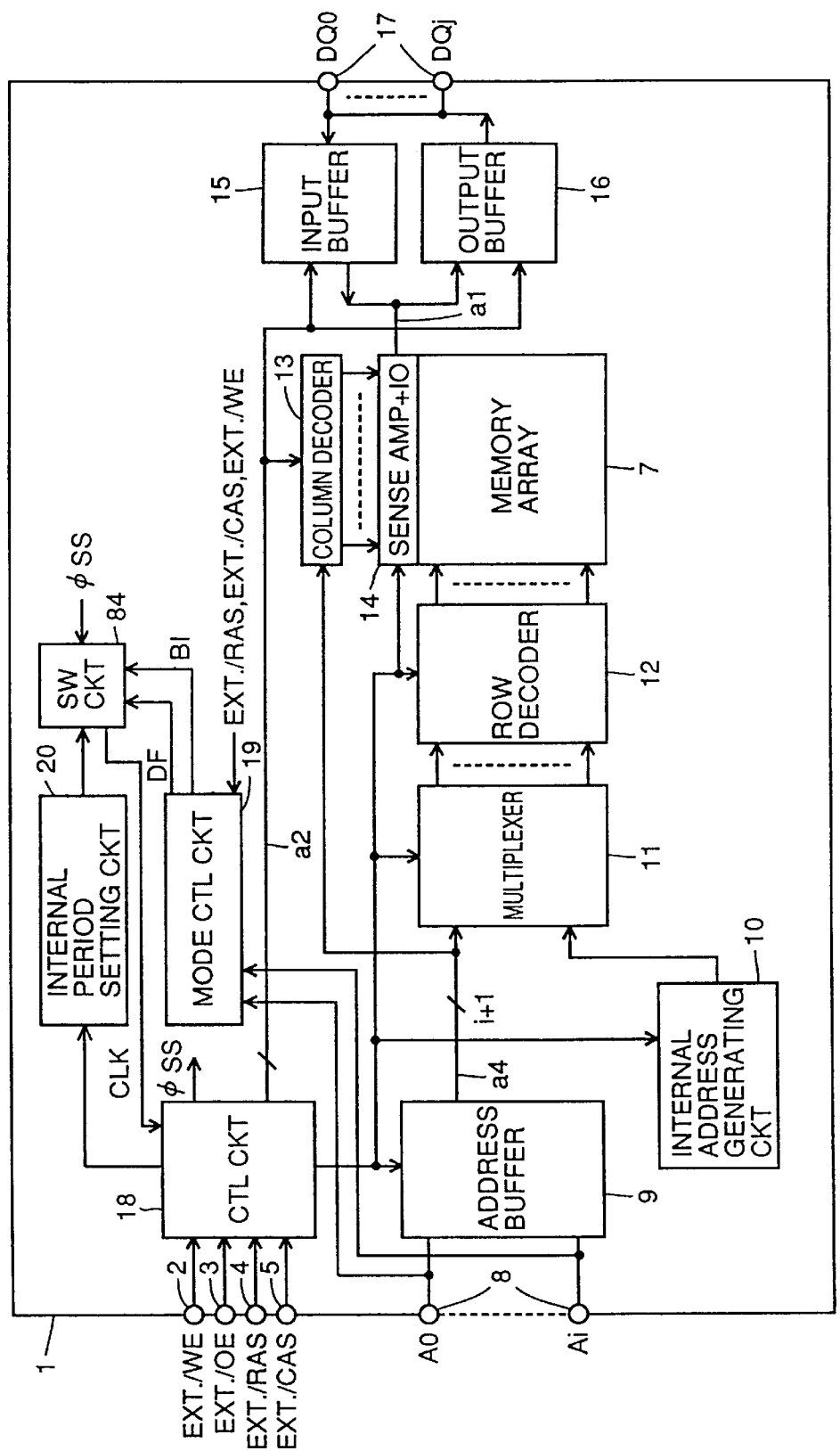
FIG. 26 is a schematic block diagram showing a structure of a semiconductor memory device in accordance with a sixth embodiment of the present invention.

FIG. 26 is a schematic block diagram showing a structure of a semiconductor memory device 1 in accordance with the sixth embodiment of the present invention.

Figure 27:
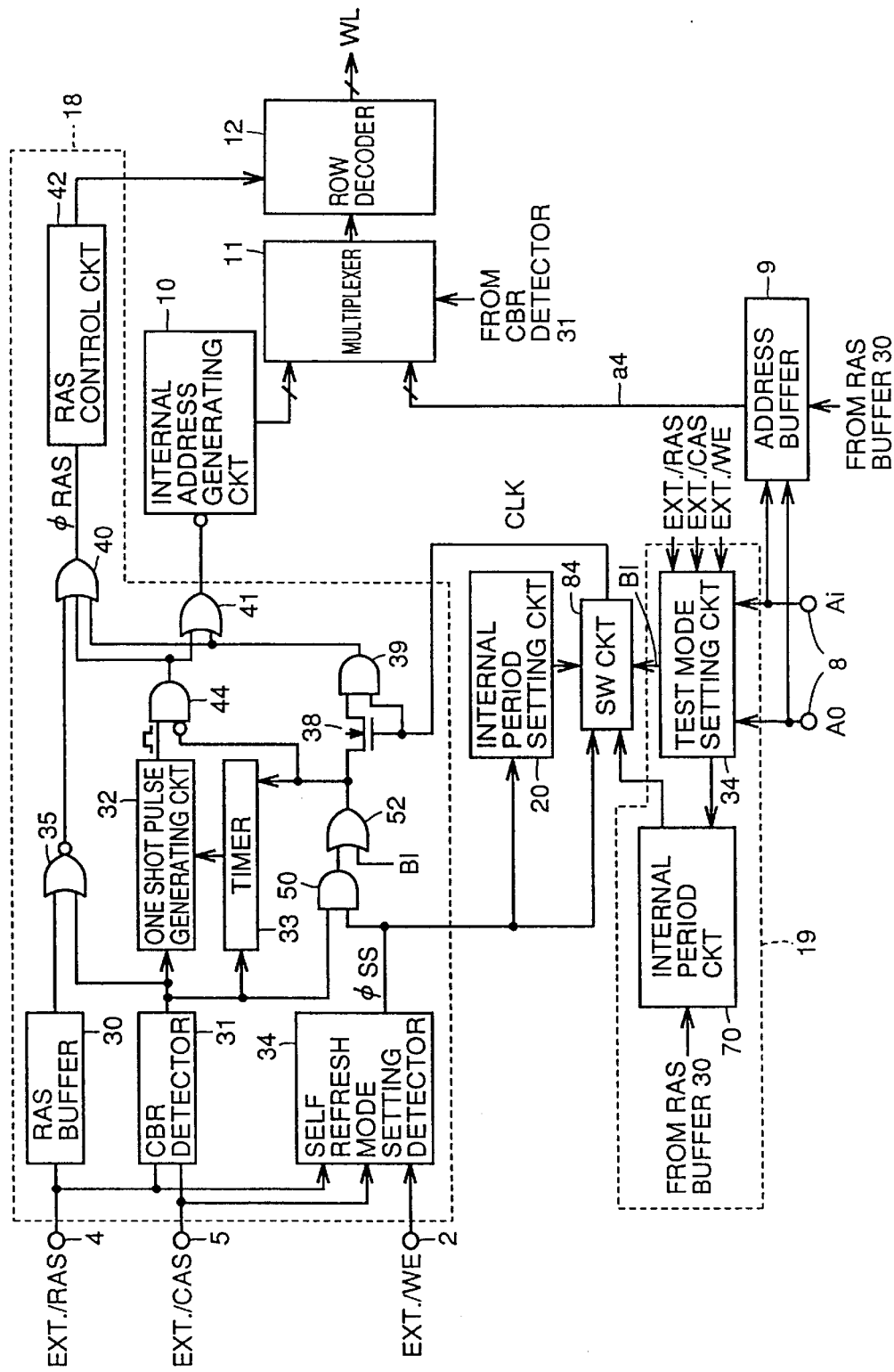
FIG. 27 is a schematic block diagram of a main portion of the semiconductor memory device in accordance with the sixth embodiment of the present invention.

FIG. 27 is a block diagram of a main portion showing, in greater detail, the structure of the semiconductor memory device 1 shown in FIG. 26.

The present embodiment differs from the fourth embodiment in the following points. First, test mode setting circuit 86 in a test mode control circuit 82 is adapted to receive external control signals EXT./RAS, EXT./CAS and EXT./WE and address signals A0 to Ai and in response to detection of test mode designation, to output a test mode designating signal BI, and internal synchronizing circuit 70 is adapted to start its operation in response.

Secondly, a switch circuit 84 receives an output from internal period setting circuit 20 and an output from internal synchronizing circuit 70 and outputs an output from internal synchronizing circuit 70 while the test mode designating signal BI is active, and outputs as an internal clock, the output from internal period setting circuit 20 while the test mode designating signal BI is inactive and self-refresh mode designating signal Φss is active.

Except these points, the structure of the circuit in accordance with the present embodiment is the same as that shown in FIG. 12, and hence corresponding portions are denoted by the same reference characters and description is not repeated.

In such a structure, when self-refresh mode is designated by the combination of external control signals EXT./RAS, EXT./CAS and semiconductor memory device 1 performs self-refresh operation in accordance with the internal clock signal CLK which is the output from external period setting circuit 20, and when the test mode is designated by the external control signals EXT.RAS, EXT./CAS and EXT./WE and address signals A0 to Ai, the device performs test mode operation using as internal clock signal CLK, the output from internal synchronizing circuit 70 which is synchronized with the clock signal applied as the external row strobe signal EXT.RAS to the external terminal 4.

Figure 28:
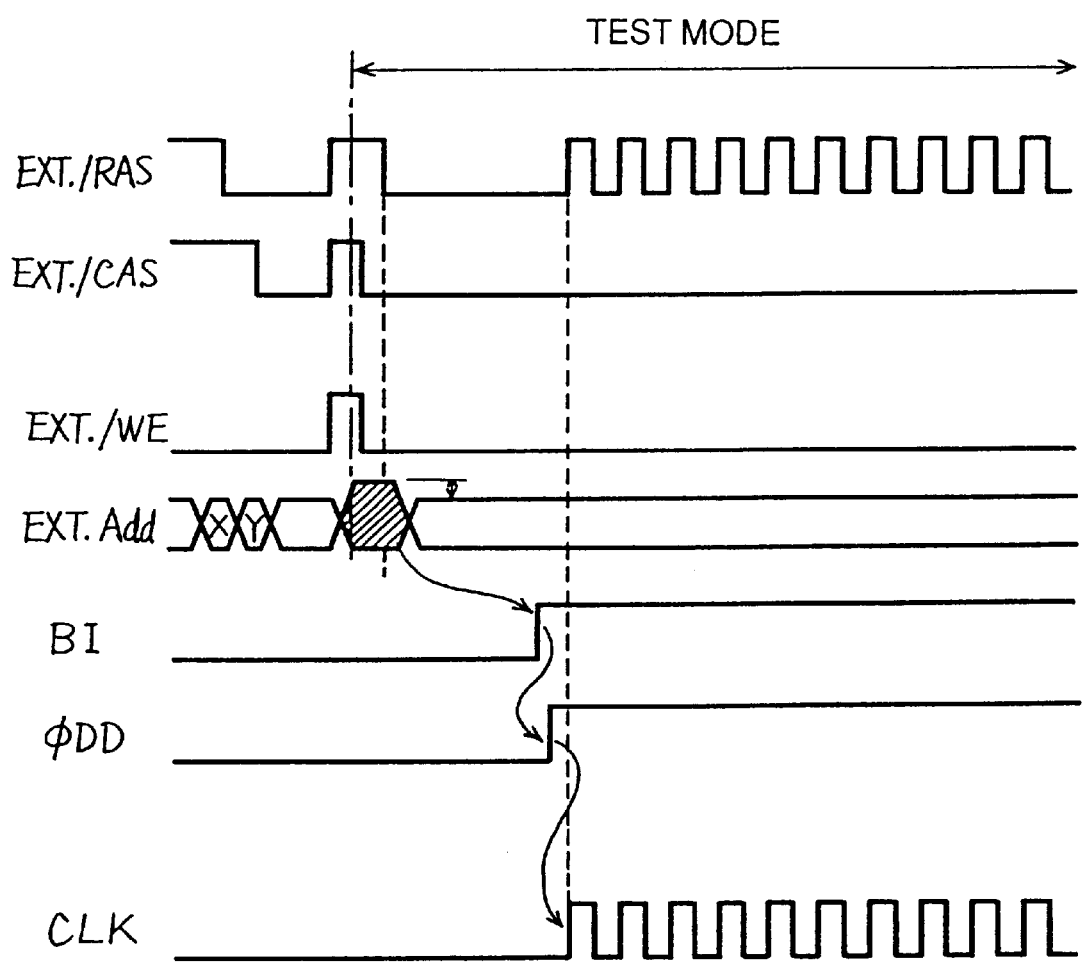
FIG. 28 is a timing chart showing an operation of the sixth embodiment of the present invention.

FIG. 28 is a timing chart showing the operation of the internal synchronizing circuit 70 shown in FIG. 27.

When the external write enable signal EXT./WE is at the "H" level, the external control signals EXT./RAS and EXT./CAS satisfy the CBR condition and external address signal EXT.Add satisfies the super Vcc condition, test mode setting circuit 86 detects designation of the test mode, and provides the test mode designating signal BI of "H" level. As the test mode designating signal BI is input to the NOR circuit 52, a signal at the "H" level is input to the transfer gate 38. Therefore, when the internal-clock signal CLK which is the output of internal period setting circuit 70 is input from switch circuit 84 to the AND circuit 39, the internal row strobe signal ERAS in accordance with the internal clock signal CLK is input to RAS control circuit 42, so that word lines are selected successively.

By the above described structure, in the test mode period, the semiconductor device 1 operates in accordance with the shaped internal clock signal output from the internal synchronizing circuit, which is synchronized with the external clock signal.

Therefore, the distortion in the waveform of the external clock signal EXT.CLK does not directly affect the operation of the internal circuitry of the semiconductor memory device.

Seventh Embodiment

Figure 29:
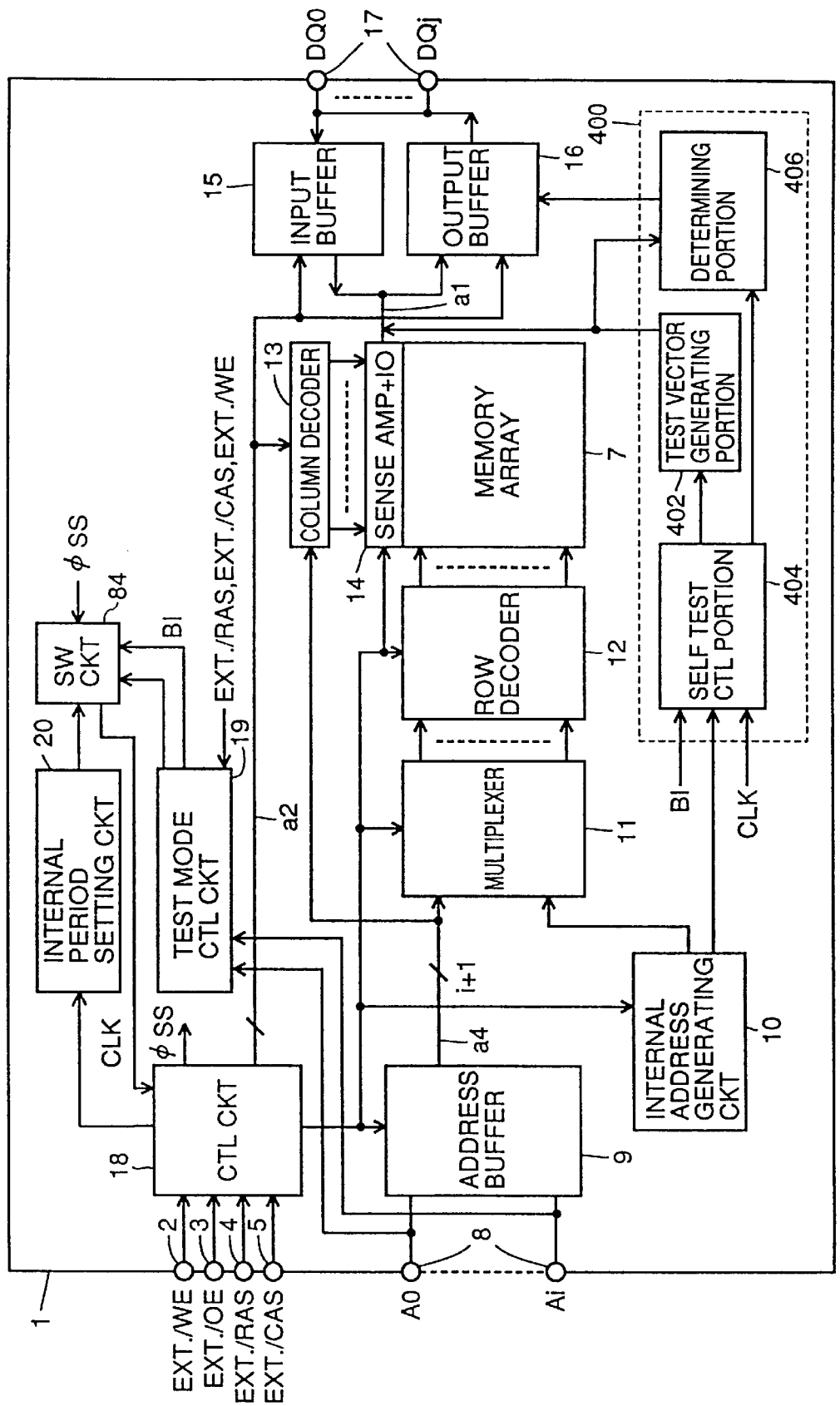
FIG. 29 is a schematic block diagram showing a structure of a semiconductor memory device in accordance with a seventh embodiment of the present invention.

The sixth embodiment was adapted such that the internal clock signal CLK is supplied to the internal circuitry as a signal synchronized with the external clock signal EXT-.CLK. However, in that embodiment, other external control signals for performing test operation are supplied to each semiconductor memory device 1 through data bus line SG on the test board. FIG. 29 is a schematic block diagram showing a structure of the semiconductor memory device 1 in accordance with the seventh embodiment. It is different from the sixth embodiment in that a self test circuit 400 is contained in the semiconductor memory device 1.

Self test circuit 400 includes a test vector generating portion 402, a self test control portion 404 and a determining portion 406.

Test vector generating portion 402 includes a counter, an ROM or an LFSR (Linear Feedback Shift Register) for generating a pseudo random number. For example, an n bit LFSR is capable of generating $2^n-1$ different pseudo random test vectors. Self test control portion starts its operation by the test mode designating signal, and controls generation of test vectors in the test vector generating portion 402 and writing operation to the memory cells. The test vector written in the memory cell is read to the determining portion 406 under the control of self test control portion 404, in which it is compared with an expected value, so that bit error is detected.

The aforementioned writing and reading may be performed alternately. However, it is possible to collect outputs of a plural times and compare only once at the end of the test, in order to improve the efficiency in testing.

By the above described circuit structure, once the test mode is externally designated, the semiconductor memory device 1 operates in accordance with the internal clock signal CLK which is synchronized with the external clock signal EXT.CLK, and continues self test operation until a bit error is detected, and hence efficiency in acceleration test such as the burn in test can be significantly improved.

Eighth Embodiment

Figure 30:
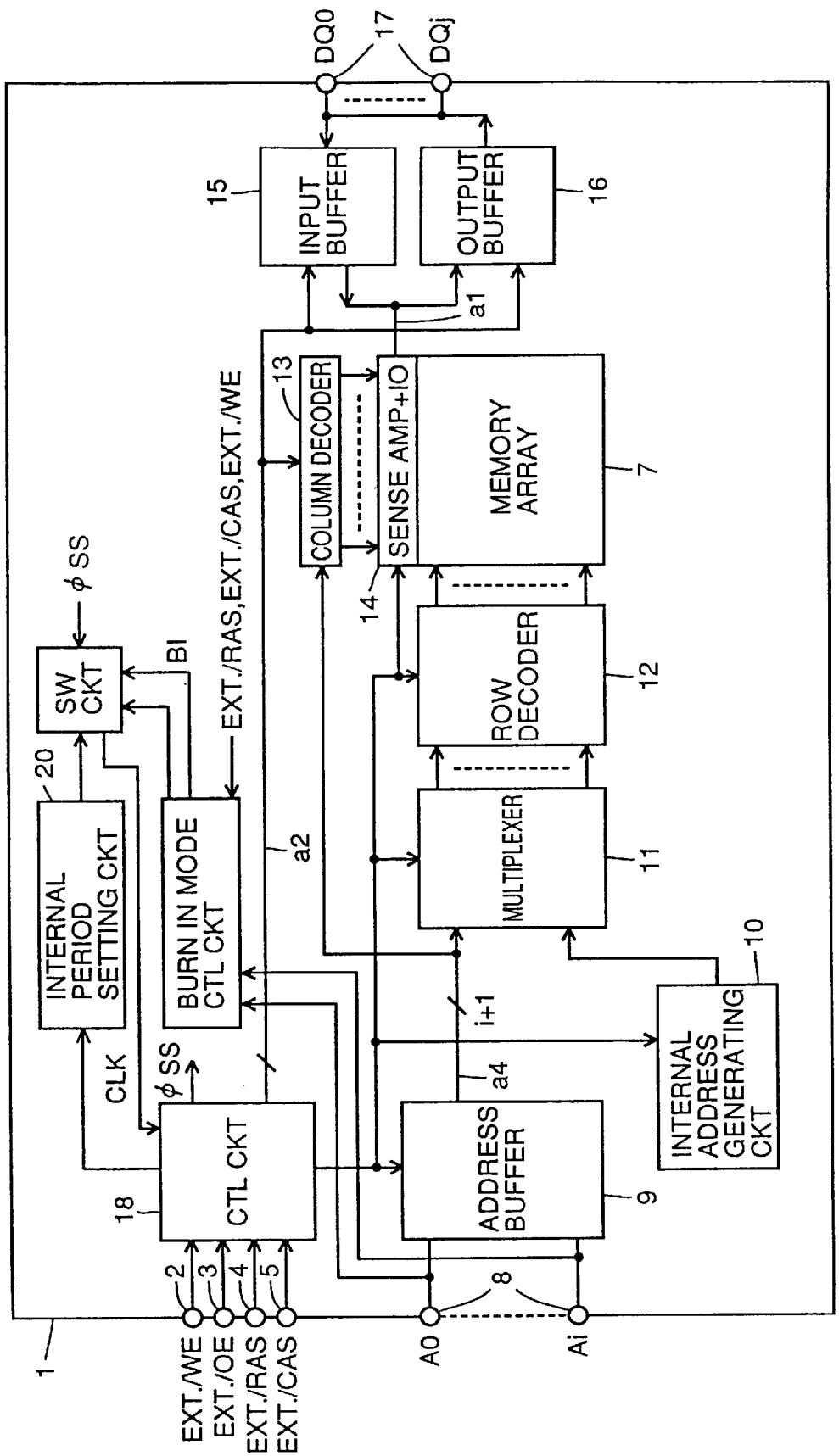
FIG. 30 is a schematic block diagram showing a structure of a semiconductor memory-device in accordance with an eighth embodiment of the present invention.

FIG. 30 is a schematic block diagram showing a structure of the semiconductor memory device 1 in accordance with the eighth embodiment of the present invention.

Figure 31:
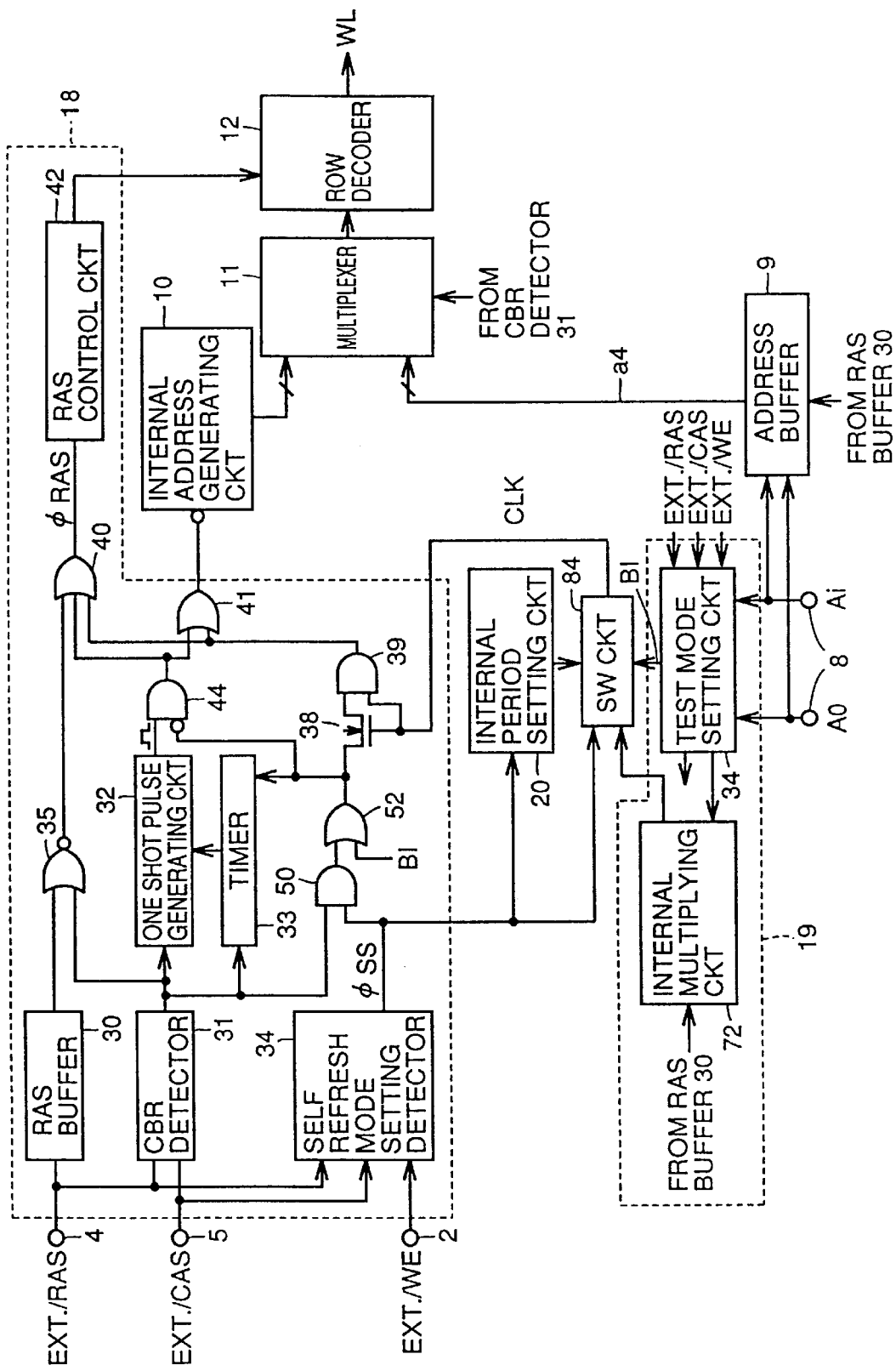
FIG. 31 is a schematic block diagram of a main portion of the semiconductor memory device in accordance with the eighth embodiment of the present invention.

FIG. 31 is a block diagram of a main portion showing in greater detail the structure of the semiconductor memory device 1 shown in FIG. 30.

The present embodiment differs from the sixth embodiment in that the internal synchronizing circuit 70 in test mode control circuit 80 is replaced by an internal multiplication circuit 72 which receives an external clock signal, for example, EXT./RAS for outputting an internal clock signal CLK by multiplying the period.

Except this point, the circuit structure is the same as that shown in FIG. 27, and corresponding portions are denoted by the same reference characters and detailed description is not repeated.

Figure 32:
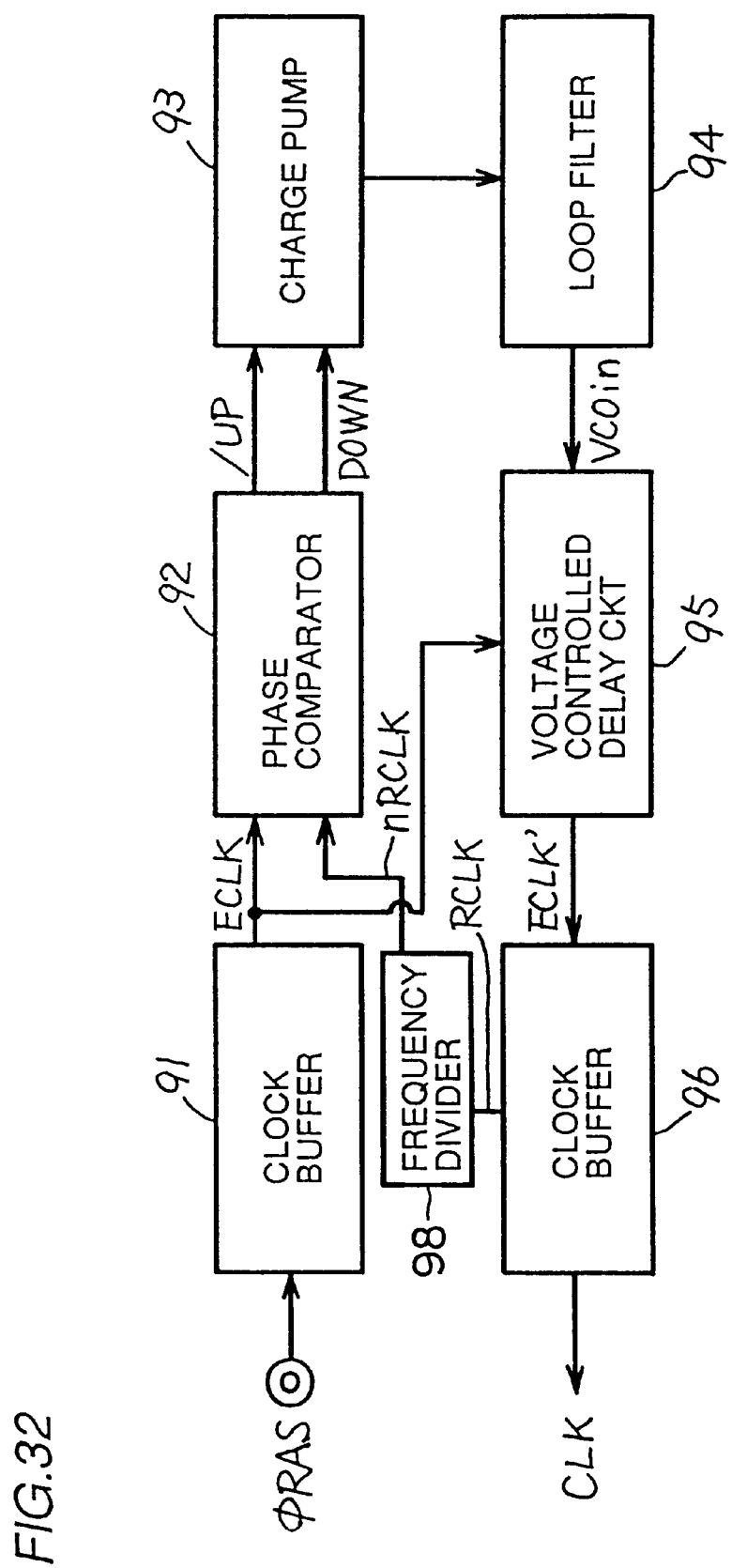
FIG. 32 is a schematic block diagram showing a structure of an internal multiplication circuit in the semiconductor memory device in accordance with the eighth embodiment of the present invention.

FIG. 32 is a schematic block diagram showing a structure of the internal multiplication circuit 72 shown in FIG. 31. The structure of internal multiplication circuit 72 differs from the internal synchronizing circuit 70 shown in FIG. 14 in that it has a frequency divider circuit 98 receiving the output signal RCLK from clock buffer 96 and divides the same to have a prescribed ratio of division.

The output signal ECLK from clock buffer 91 and an output signal nRCLK from the frequency dividing circuit 98 are input to phase comparator 92. The ratio of division of frequency dividing circuit 98 is 16, a signal having sixteen times the period of the output signal ECLK' from voltage controlled delay circuit 95 is input to the phase comparator 92, and charge pump circuit 93 is controlled such that the received signal has its phase matched with the signal ECLK which is in accordance with the external clock signal EXT./RAS.

Therefore, the internal clock signal CLK output from clock buffer 96 comes to have the period one sixteenth that of the external clock signal EXT./RAS.

Namely, a signal obtained by multiplying the external clock signal EXT./RAS is output as the internal clock signal CLK.

Therefore, even when the external clock signal operates with sufficiently slow period, the internal clock signal CLK may operate at high speed. The influence of the distortion in the waveform of external clock signal EXT./RAS on the test board becomes more serious as the period of the external clock signal EXT./RAS is shorter, and hence influence of the distortion in the waveform on the test board can be suppressed by the above described structure.

In this embodiment, also, the period of the internal clock signal CLK can be varied by changing the ratio of division of the frequency dividing circuit 98 by using the internal clock period control signal FS. This embodiment can also have the internal clock signal adapted to be output to the external terminal such as the EXT./CAS terminal 5.

Further, by inputting the aforementioned multiplied internal clock signal CLK to the output buffer circuit, a structure may be provided in which the output buffer circuit can be subjected to acceleration test simultaneously.

Figure 33:
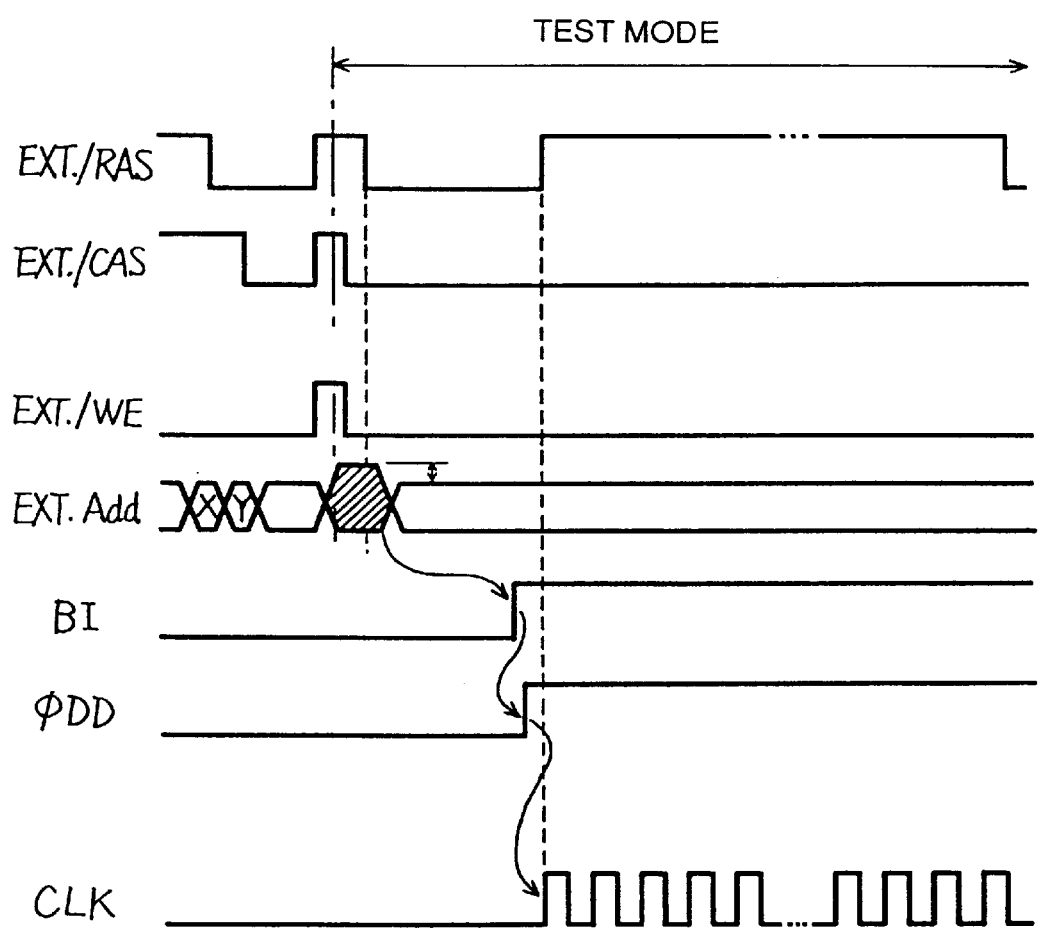
FIG. 33 is a timing chart showing an operation of the eighth embodiment of the present invention.

FIG. 33 is a timing chart showing the operation of the eighth embodiment. In the same manner as in the sixth embodiment, the WCBR condition is designated by the external control signals EXT./RAS, EXT./CAS and EXT./WE and by setting the address signal EXT./Add to the super Vcc condition, the device enters the test mode, and thereafter, the internal clock signal CLK which is obtained by multiplying the period of the EXT./RAS signal is output.

Ninth Embodiment

Figure 34:
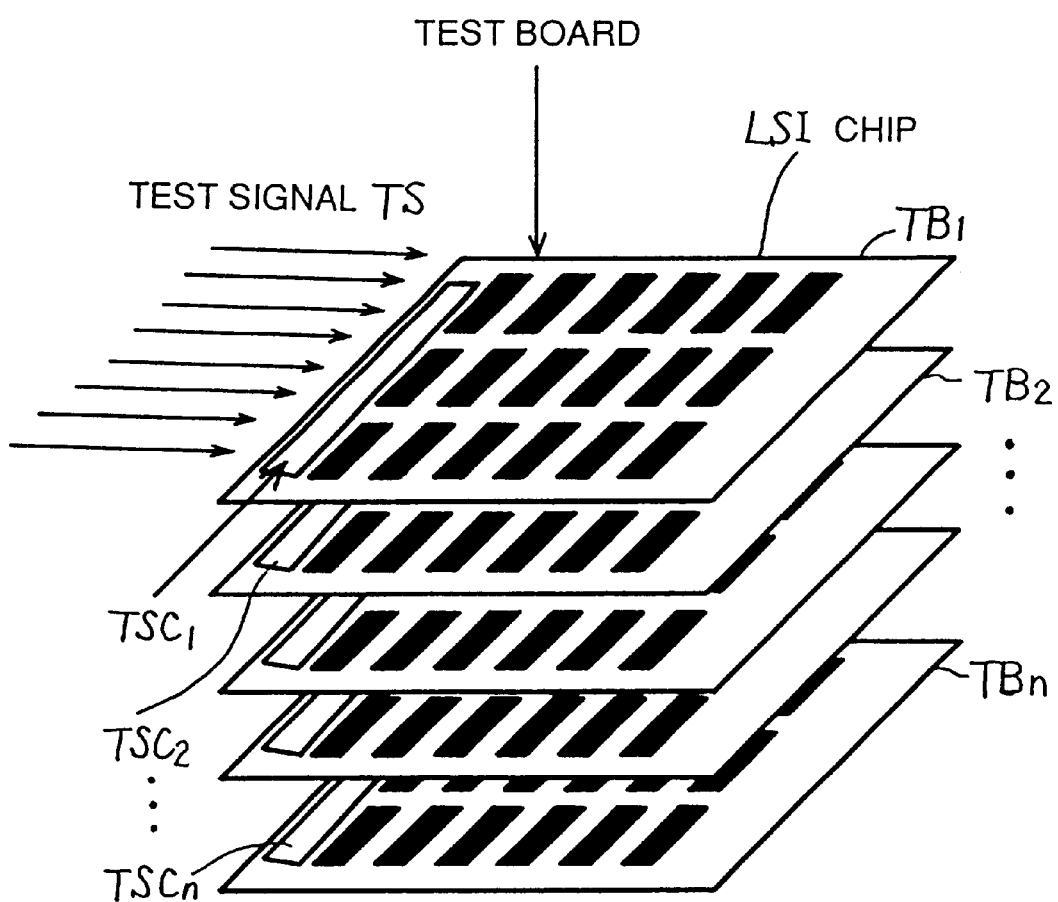
FIG. 34 is a schematic block diagram showing a structure of a parallel tester in accordance with a ninth embodiment of the present invention.

FIG. 34 is a schematic block diagram showing a structure of a parallel tester in accordance with the ninth embodiment of the present invention.

In the first to seventh embodiments, each semiconductor memory device has an oscillating circuit or a synchronizing circuit therein for shaping the distortion in the waveform of the external clock signal on the test board.

As a method of modifying distortion in the waveform of the external clock signal EXT.CLK on the test board, different from the above described method, a structure may be used in which a plurality of synchronizing circuits are provided on each board and the external clock signal is shaped on the test board.

Further, in order to obtain similar effect, the test board may be divided into a plurality of pieces, and test clock signal RCLK may be generated on each piece of the test board in synchronization with the external clock signal EXT.CLK.

Referring to FIG. 34, a plurality of semiconductor memory devices 1 are arranged divided onto a plurality of test boards, and the test boards $TB_1$ to $TB_n$ have corresponding test board synchronizing circuits $TSC_1$ to $TSC_n$, respectively. The externally applied external clock signal EXT.CLK is synchronized and shaped by each test board synchronizing circuit $TSC_i$ and output as a test board testing signal to each semiconductor memory device.

When the external clock signal EXT.CLK has its waveform distorted by the signal delay caused by the parasitic capacitance Cp on the test board and the operation of the semiconductor memory device becomes different from each other, conditions for acceleration such as in the burn in test come to differ from device to device. However, the above described structure of the parallel tester can solve this problem.

Tenth Embodiment

From the first to ninth embodiments, structure of a semiconductor memory device and structure of a parallel tester which can operate even when the period of the external clock signal is made faster at the time of acceleration test such as burn in test in accordance with the externally applied clock signal or test signal have been described.

In order to carry out parallel acceleration test or the like at high speed, it is necessary to speed up the clock signal for operation and, specifically in the acceleration test of semiconductor memory devices, it is important to reduce time for writing data and for comparison of data with an expected value after reading.

The tenth embodiment shows a structure of a semiconductor memory device which allows writing of memory information for testing at high speed to the memory cells in the semiconductor memory device 1.

Figure 35:
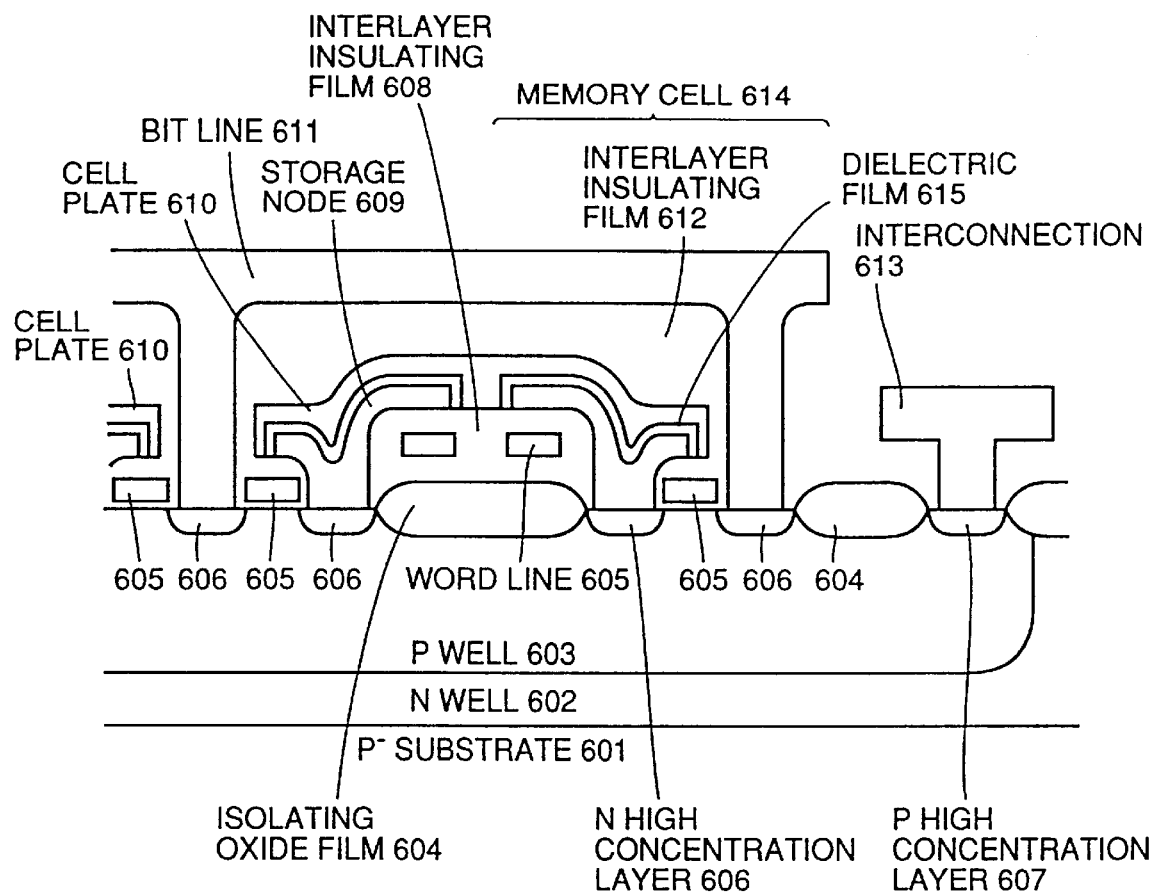
FIG. 35 is a cross section showing a structure of a memory cell in the semiconductor memory device in accordance with a tenth embodiment of the present invention.

FIG. 35 is a cross section showing a structure of a memory cell portion in a typical DRAM. Referring to FIG. 35, a DRAM memory cell 614 includes a memory cell transistor including an N type high concentration layer 606 to which a bit line 611 is connected and an N type high concentration layer 606 to which a word line 605 and a storage node 609 are connected, and a memory cell capacitor including a storage node 609 storing charges, a dielectric film 615 and a cell plate 610 which is an opposing electrode of the capacitor.

Elements are separated by a separating oxide film 604 from each other, and P type well 603 and an N type well 602 are formed in substrate 1. P type well 603 is supplied with a potential through a P type high concentration layer from an interconnection 613 so that its potential is fixed.

Figure 36:
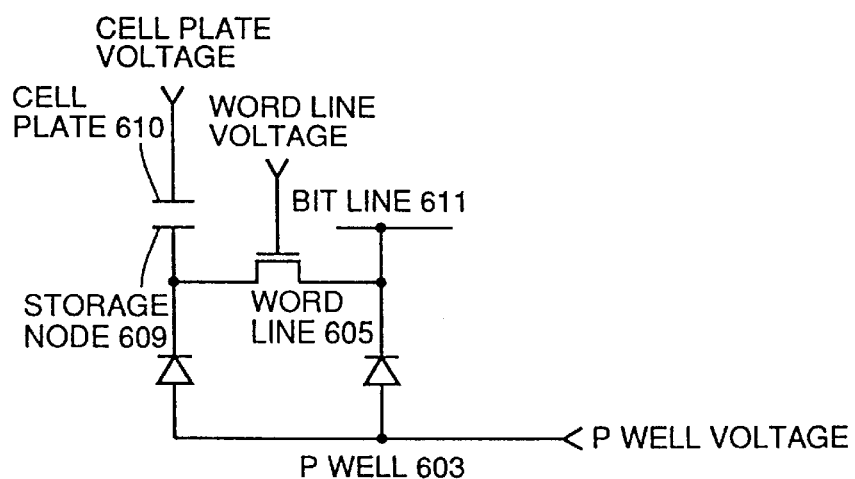
FIG. 36 is a schematic diagram showing an equivalent circuit of the memory cell shown in FIG. 35.

FIG. 36 is an equivalent circuit diagram of the memory cell portion shown in FIG. 35. Referring to FIG. 36, storage node 609 which is the charge storing capacitor electrode of the memory cell is connected to the P well 603 by a diode structure. It is possible to transfer charges to storage node 609 through P well 603.

More specifically, referring to FIG. 35, by controlling potentials of interconnection 613 and cell plate 610 connected to P well through P type high concentration layer 607 independent from each other, it becomes possible to introduce charges to storage node 609 from the side of P well 603. The method of introducing charges will be described in the following.

Figure 37:
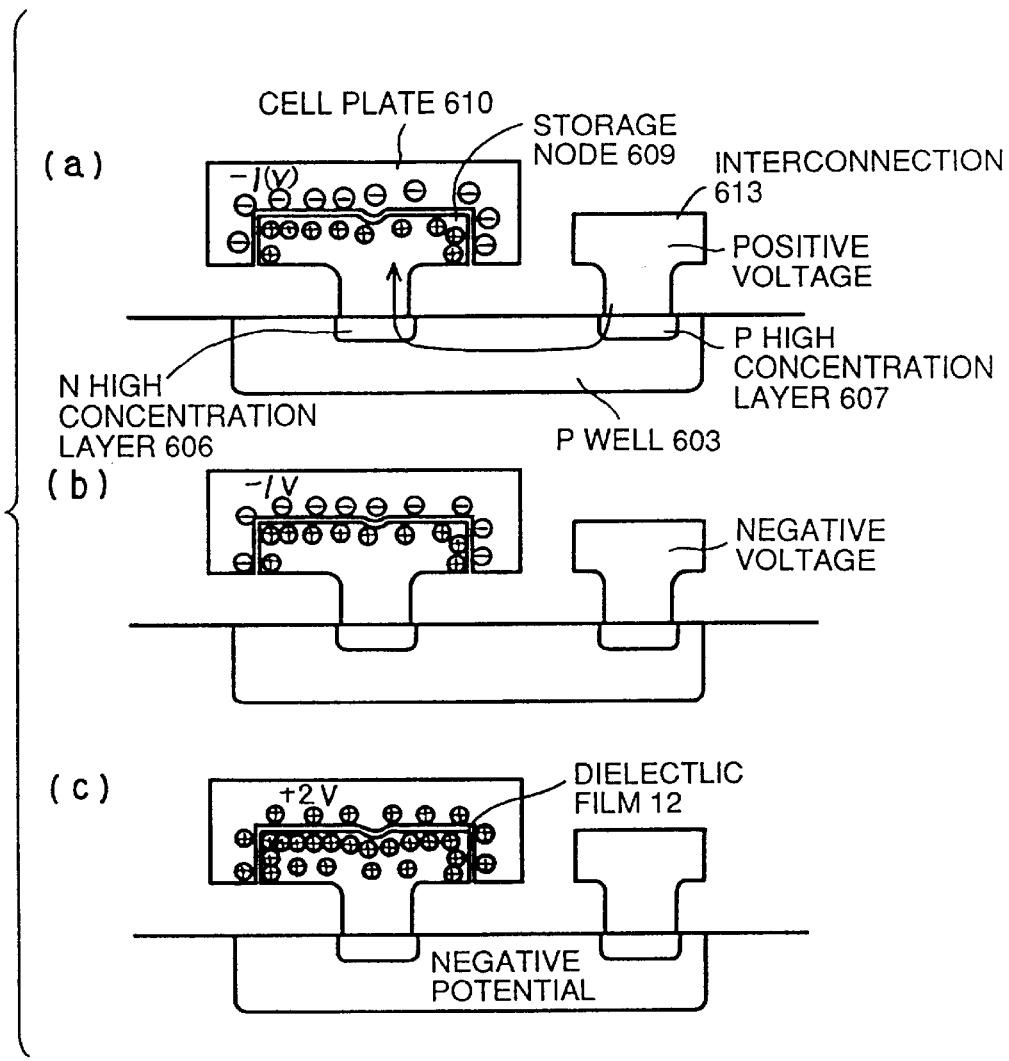
FIG. 37 is a cross section showing the flow of operation in accordance with the tenth embodiment of the present invention.

FIG. 37 is an illustration of a method of writing data at "H" level collectively to each of the memory cells.

In the following, a method of writing data at "H" level to the memory cells when the power supply voltage is 4 volt and cell plate voltage is 2 volt will be described as an example.

Referring to FIG. 37(*a*), a positive voltage is applied from interconnection 613 to P well 603. Thus positive charges can be introduced to storage node 609. 3; The amount of charges introduced at this time takes into account the forward voltage drop at the PN junction between P well 603 and N type high concentration layer 606. At this time, the potential at cell plate 610 is set to −1 V and positive potential on the side of the P well is set to the following value:

(Positive potential on the side of the P well)=+1+(forward voltage drop of PN junction between P well 603 and N type high concentration layer 606) (V).

By this setting, the potential at storage node 609 will be +1 V.

Referring to FIG. 37(*b*), a negative potential is supplied to P well 3 through interconnection 613. At this time, the negative potentials supplied must be low enough to prevent a leak current, when the N type high concentration layer 606 connected to the storage node 609 of the DRAM and the P well 603 is reversely biased, from hindering charge holding characteristic of the memory cell, and it must be at a level sufficient to keep low the leak current between N type high concentration layers 606 of adjacent memory cells so that the leak current does not hinder the charge holding characteristics of the memory cells. Further, the aforementioned negative potential must be at a level which is sufficient to prevent the subthreshold current of the switching transistor of the memory cell from hindering charge holding characteristic of the memory cell.

Referring to FIG. 37(*b*), the charges stored in storage node 609 are maintained by the negative potential at cell plate 610.

Referring to FIG. 37(*c*), when the potential at cell plate 610 is increased to +2 V, the storage node 609 facing thereto with a dielectric film 612 interposed has its potential increased by inductive coupling. Therefore, the memory cell is set to a state in which "H" data (corresponding to +4 V) is written.

Figure 38:
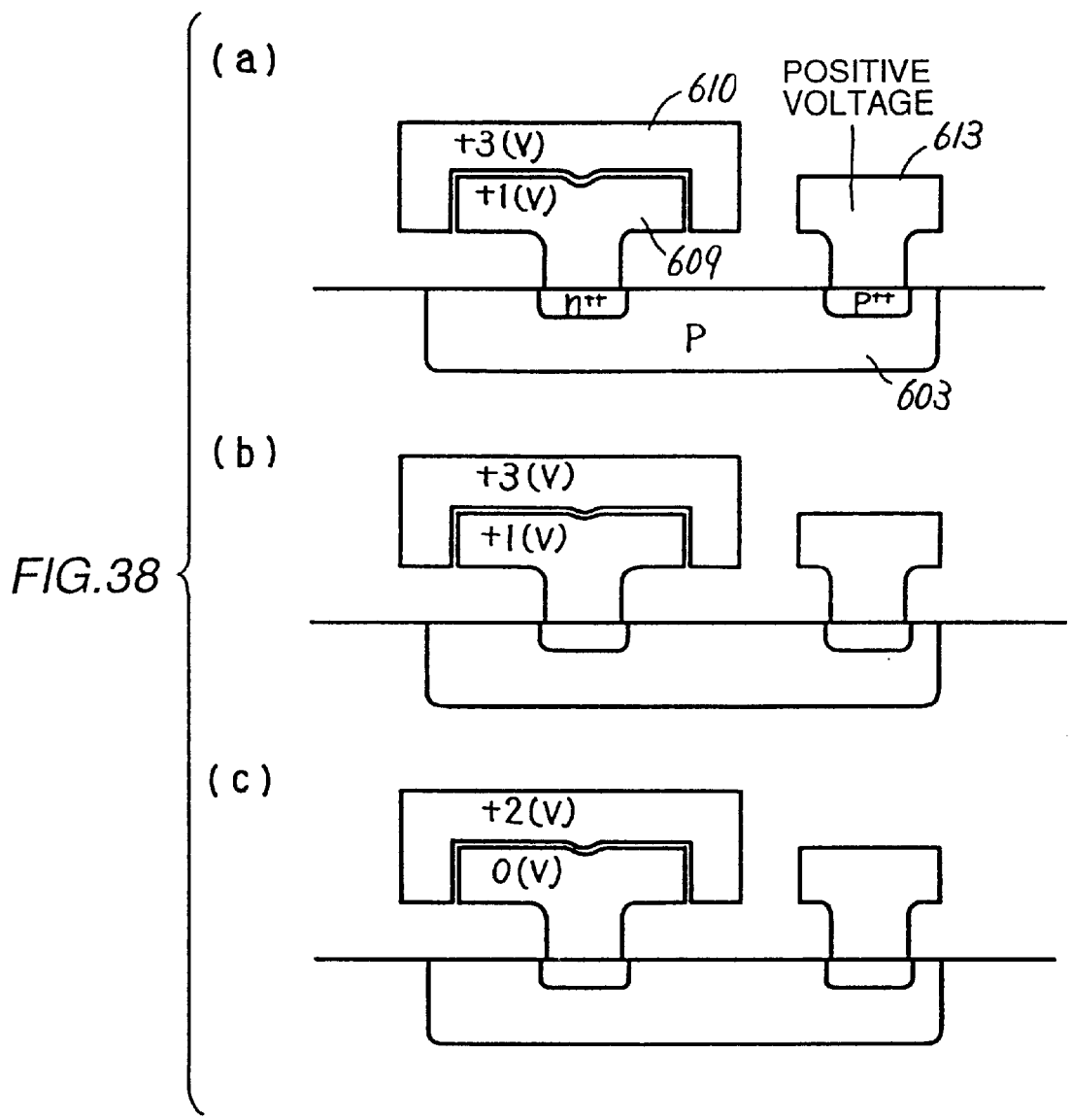
FIG. 38 is another cross section showing the flow of operation of the tenth embodiment of the present invention.

FIG. 38 is an illustration of a method of writing "L" level data collectively to the memory cells of the semiconductor memory device 1.

In the following, a method of writing "L" level data to the memory cells when the power supply voltage is 4 V and cell plate voltage is 2 V will be described.

Referring to FIG. 38(*a*), a positive voltage is applied from interconnection 613 to P well 603, and thus charges are introduced to storage node 609. At this time, the amount of introduction takes into consideration the forward voltage drop at the PN junction between P well 603 and N type high concentration layer 606. At this time, the potential of cell plate 610 is set to +3 V and the positive potential on the side of the P well is set to the following value:

(Positive potential on the side of P well) =+1+(forward voltage drop at PN junction between P well 603 and N type high concentration layer 606) (V).

By the above setting, the potential at storage node 609 will be +1 V.

Referring to FIG. 38(*b*), a negative potential is supplied through interconnection 613 to P well 603. At this time, the negative potential supplied must be low enough so that the leak current, when the N type high concentration layer 606 connected to storage node 609 in the DRAM and P well 603 is reversely biased, does not hinder the charge holding characteristic of the memory cell, and it must be low enough so that the leak current between N type high concentration layers 606 of adjacent memory cells does not hinder the charge holding characteristic of each of the memory cells. Further, the negative potential must be maintained low enough so that the subthreshold current of the switching transistor of the memory cell does not hinder the charge holding characteristic of the memory cells.

In FIG. 38(*b*), the charges held in the storage node 609 is held by the negative potential at cell plate 610.

Referring to FIG. 38(*c*), when the potential at cell plate 610 is lowered to +2 V, the storage node 609 facing thereto with dielectric film 612 interposed experiences potential drop by coupling. Therefore, the memory cell is set to a state in which "L" level data is written.

Figure 39:
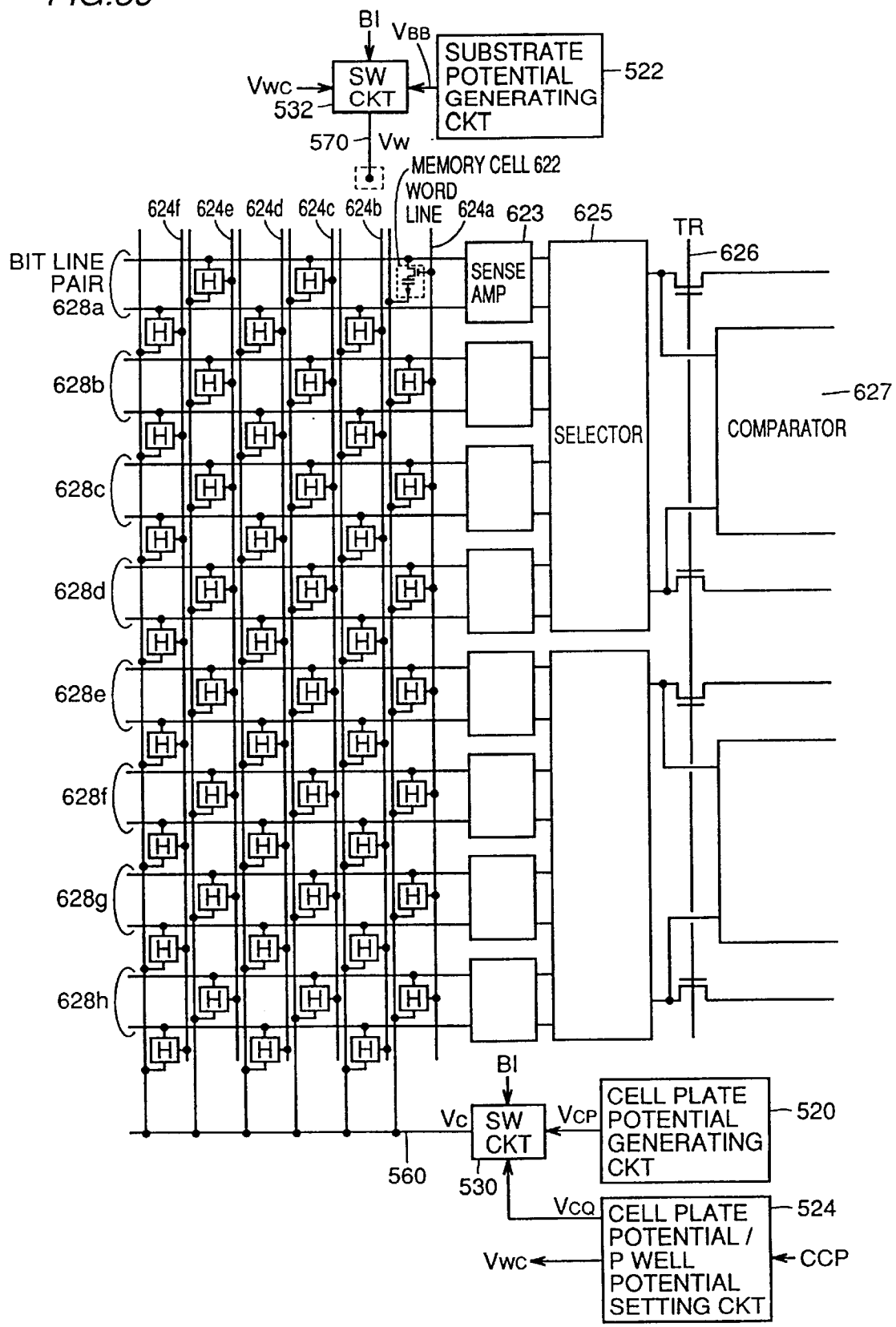
FIG. 39 is a schematic block diagram of a main portion of the semiconductor memory device in accordance with the tenth embodiment of the present invention.

FIG. 39 is a schematic block diagram showing an example of a circuit structure of the semiconductor memory device 1 allowing the above described method of collective writing of data to the memory cells.

At crossings between bit line pairs 628*a* to 628*h* and word lines 624*a* to 624*f*, memory cells 622 are arranged. When information stored in a memory cell 622 arranged at a crossing between word line 624a and bit line pair 628a is to be read, the potential of word line 624a is set to "H" level. Consequently, memory cell transistor is rendered conductive, and charges stored in memory cell capacitor causes potential difference at the potential of bit line pair 628a. This small potential difference is amplified by sense amplifier 623, and it is coupled to I/O line by selector 625, and hence data is externally read out.

In the semiconductor memory device 1 shown in FIG. 39, in normal operation, the potential Vc of cell plate 610 is maintained at the potential Vcp generated by a cell plate potential generating circuit 520. The output Vcp from cell plate potential generating circuit is connected to an interconnection 560 which is connected to the cell plates of memory cells by a switch circuit 530. Meanwhile, the potential Vw of P well 603 in each of the memory cells is held at a constant value $V_{BB}$ by a substrate potential generating circuit 522 in the normal operation. The output of the substrate potential generating circuit is connected to an interconnection 570 connected to the P well 3 of each memory cell by switch circuit 532.

When collective write operation of data to the memory cells described with reference to FIGS. 37 and 38 is to be performed, the outputs $V_{CQ}$ and $V_{WC}$ of cell plate potential/P well potential setting circuit 524 are supplied to cell plate and P well 603 through switch circuits 530 and 532, respectively. In response to the external control signal CCP, cell plate/P well potential setting circuit 524 controls the cell plate potential and the P well potential, and hence "H" level data or "L" level data are written collectively to the memory cell.

Figure 40:
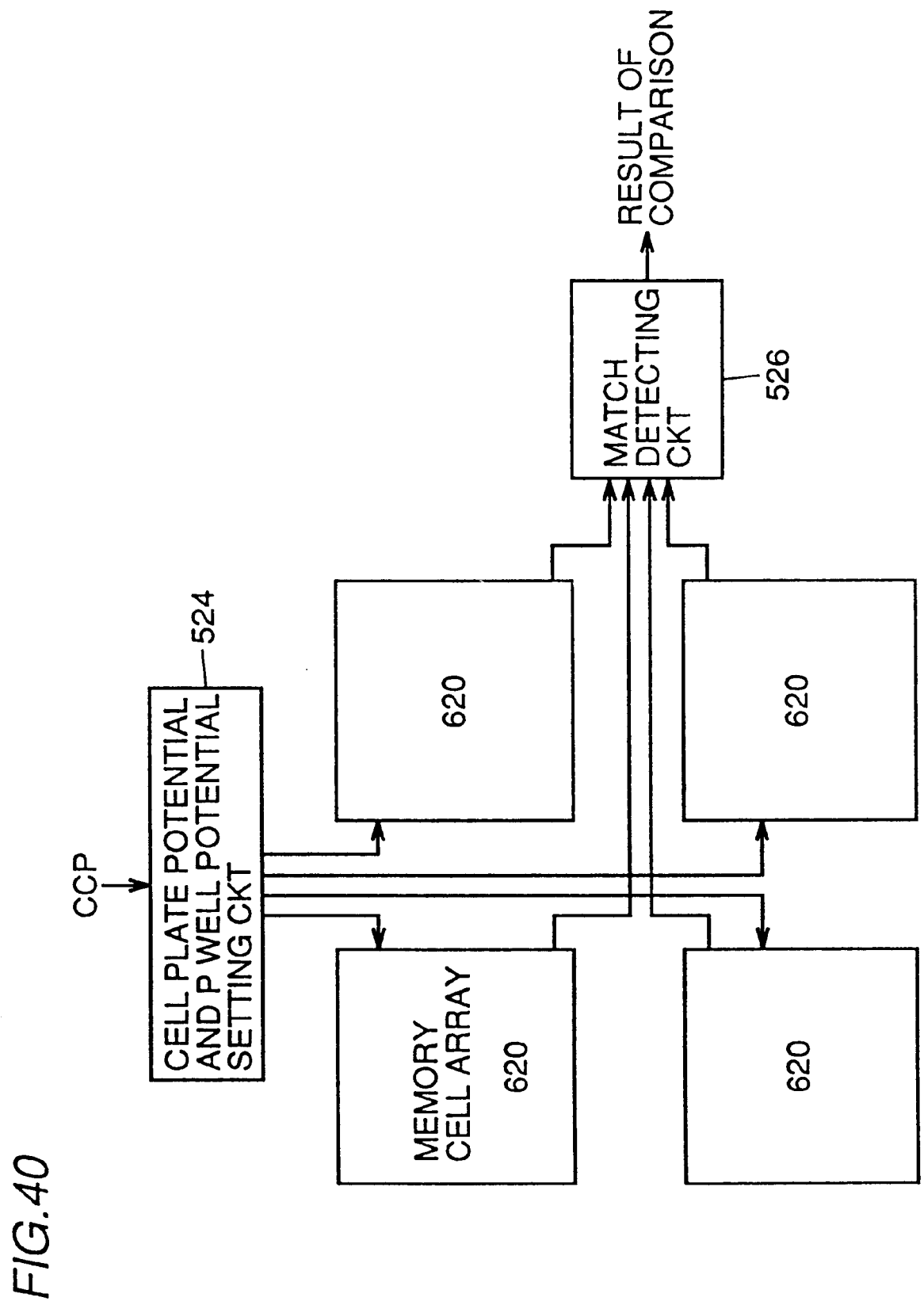
FIG. 40 is a schematic block diagram showing a structure of the tenth embodiment of the present invention.

FIG. 40 is a schematic block diagram showing a circuit structure allowing test of such a DRAM that employs the above described data writing method. In the cell plate potential/P well potential setting circuit 524, data to be written to the memory cell of each of the memory cell array 620 divided into four is determined, writing operation is performed, data is read from each memory cell array, and the read value is compared with the expected value to detect a defect. At this time, the number of data read simultaneously may be arbitrarily set by circuit design or by employing an array multiple division architecture. Further, conversion of a plurality of data read simultaneously is performed by match detecting circuit 526 provided in semiconductor memory device 1. Thus the plurality of data read from respective memory cell arrays are determined to be matching or not matching.

Eleventh Embodiment

Figure 41:
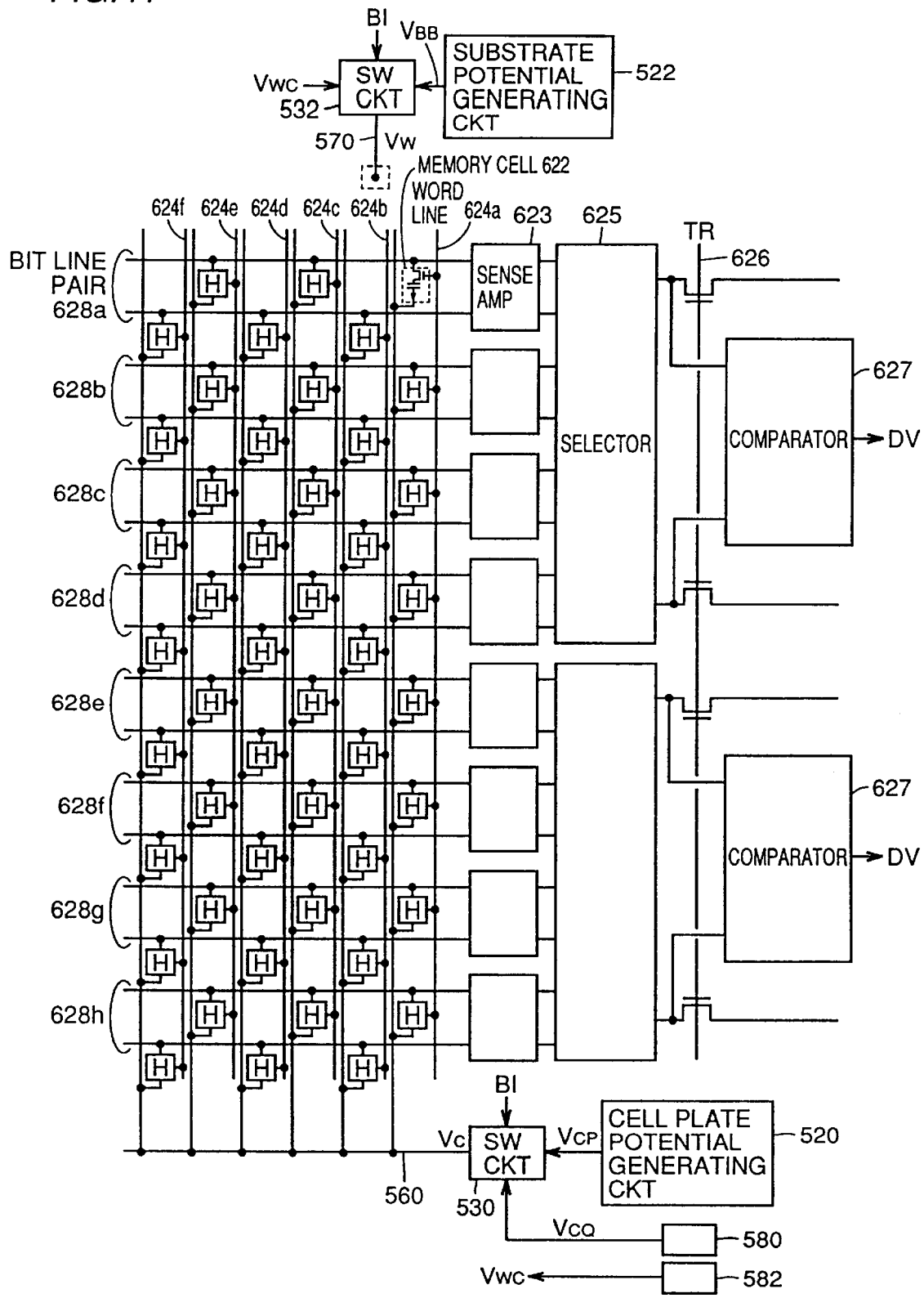
FIG. 41 is a schematic block diagram showing a main portion of the semiconductor memory device in accordance with an eleventh embodiment of the present invention.

FIG. 41 is a schematic block diagram showing a structure of a semiconductor memory device in accordance with the eleventh embodiment of the present invention.

Different from the tenth embodiment, during the test mode period, the cell plate potential and the P well potential can be controlled by external terminals 580 and 582 through switch circuits 530 and 532.

When test operation is to be performed in the semiconductor memory device 1 having the above described structure, first, the test mode is designated by an external control signal, and by the test mode designating signal BI, switching circuits 530 and 532 connect the external terminals 580 and 582 to the cell plate and to the P well, respectively.

By controlling the cell plate potential and the P well potential by an external tester, prescribed-memory cell data is written to each memory cell array 620. In this case, even when "H" data is written to all the memory cell arrays, the data read out may include both the "H" level and "L" level because of memory cell arrangement, as shown in FIG. 41. For example, when word line 624a is activated, "H" level data is output from memory cell 622. However, if the word line 624b is activated, the bit line to which memory cell 622 is connected would be at "L" level.

Therefore, when it is to be compared with the expected value, such state of inversion of the data must be recognized in advance on the side of the external tester. In FIG. 41, four bit line pairs, for example bit line pairs 628a, 628b, 628c and 628d as well as bit line pairs 628e, 628f, 628g and 628h are connected through selector circuit 625 through comparator 627. Therefore, when word line 624a is activated, "H" data is output from memory cells 622 of bit line pairs 628a and 628b. However, if the word line 624b is activated, "L" data is output from memory cells 622 of bit line pairs 628a and 628b.

Therefore, expected values of data to be read are stored in advance in the external tester, and these values are input to the comparator 627 in advance. Thereafter, reading operation is performed and transistor 626 is activated so as to input the output from selector circuit 625 to comparator 627, whereby comparison between each bit data and the expected value can be carried out collectively, parallel to each other.

Each comparator outputs the result of comparison with the expected value to the outside through a signal line DV. By using the test method in the above described manner, it becomes possible to detect bit error of each memory cell collectively in parallel and hence the time necessary for testing the semiconductor memory device 1 can be significantly reduced.

Twelfth Embodiment

In the tenth and eleventh embodiments, data for testing can be written collectively to the memory cells, and hence the time for the test of the semiconductor memory device 1 can be reduced. However, the above described method of testing has a disadvantage that the influence of interference caused by the change in data pattern from the memory cells, that is, memory cell pattern dependency, cannot be detected. This is because only the same data can be written to the memory cells connected to the same cell plate. Generally, the memory cells connected to an arbitrary bit line pair are connected to the same cell plate, and hence this problem occurs.

Figure 42:
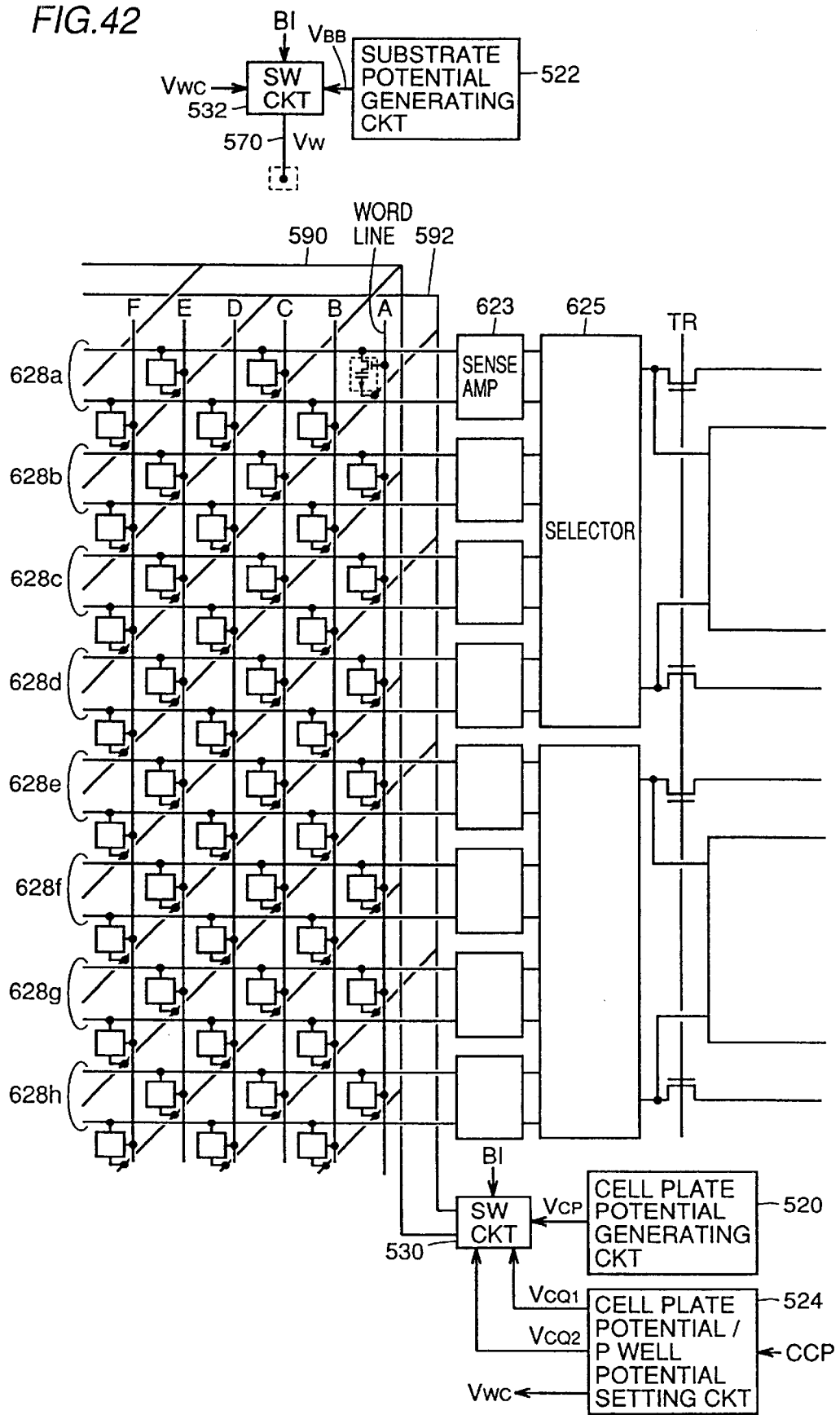
FIG. 42 is a schematic block diagram showing a structure of a semiconductor memory device in accordance with a twelfth embodiment of the present invention.

FIG. 42 is a schematic block diagram showing the structure of the semiconductor memory device 1 for solving the above described problem. Different from the first embodiment, the interconnection commonly connecting the cell plates from each other is divided into two sets, as will be described in the following.

More specifically, a first cell plate interconnection 590 is connected to the cell plates of memory cells connected to every other lines of cells in a diagonal direction of the bit line pair and the word lines connected to the memory cells.

By contrast, a second cell plate interconnection 512 is commonly connected to remaining memory cells which are not connected to the first cell plate interconnection 731. Cell plate potential/P well potential setting circuit 524 is adapted to control the potential ($V_{CQ1}$ and $V_{WC}$) of the first cell plate interconnection 590 and P well interconnection 570 as well as potentials ($V_{CQ2}$ and $V_{WC}$) of the second cell plate interconnection 592 and P well interconnection 570 independent from each other.

Figure 43:
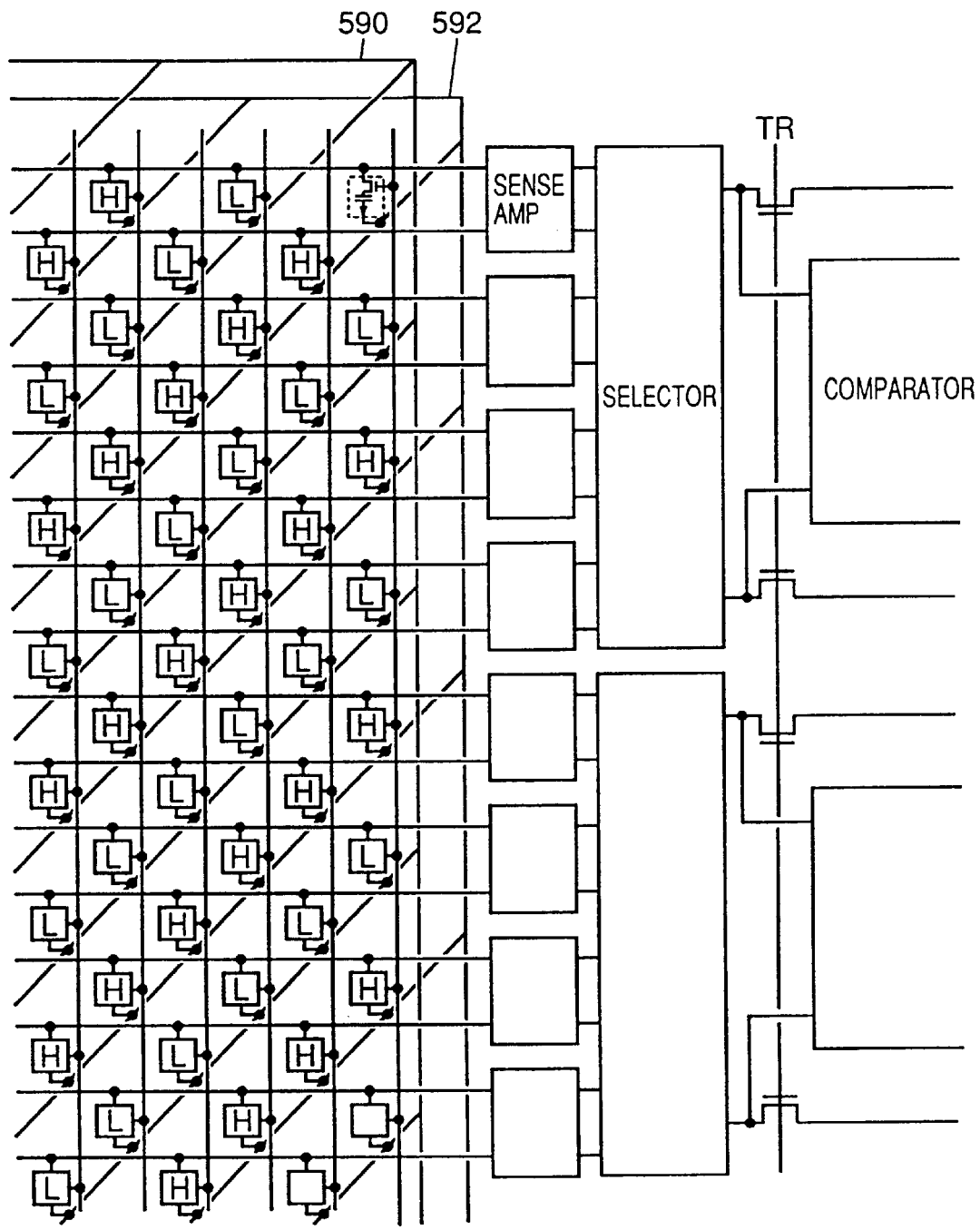
FIG. 43 shows memory pattern of memory cells after implementation of the twelfth embodiment of the present invention.

FIG. 43 shows a state in which test data is written to the memory cells collectively in such a semiconductor memory device 1 having the above described structure.

Referring to FIG. 43, the first cell plate interconnection 731 is used for writing "L" level, and the second cell plate interconnection 732 is used for writing "H" level in accordance with the method described with reference to FIGS. 37 and 38, and the figure shows the data written to respective memory cells by this method. Referring to FIG. 43, since the cell plate is separated diagonally, "H" level memory cells and "L" level memory cells continue in diagonal stripes. Therefore, the states of the memory cells connected to one word line are alternating CHIN level and "L" level, and hence data of adjacent memory cells are inverted from each other. Therefore, influence of interference between memory cells on the data can be detected.

Thirteenth Embodiment

Figure 44:
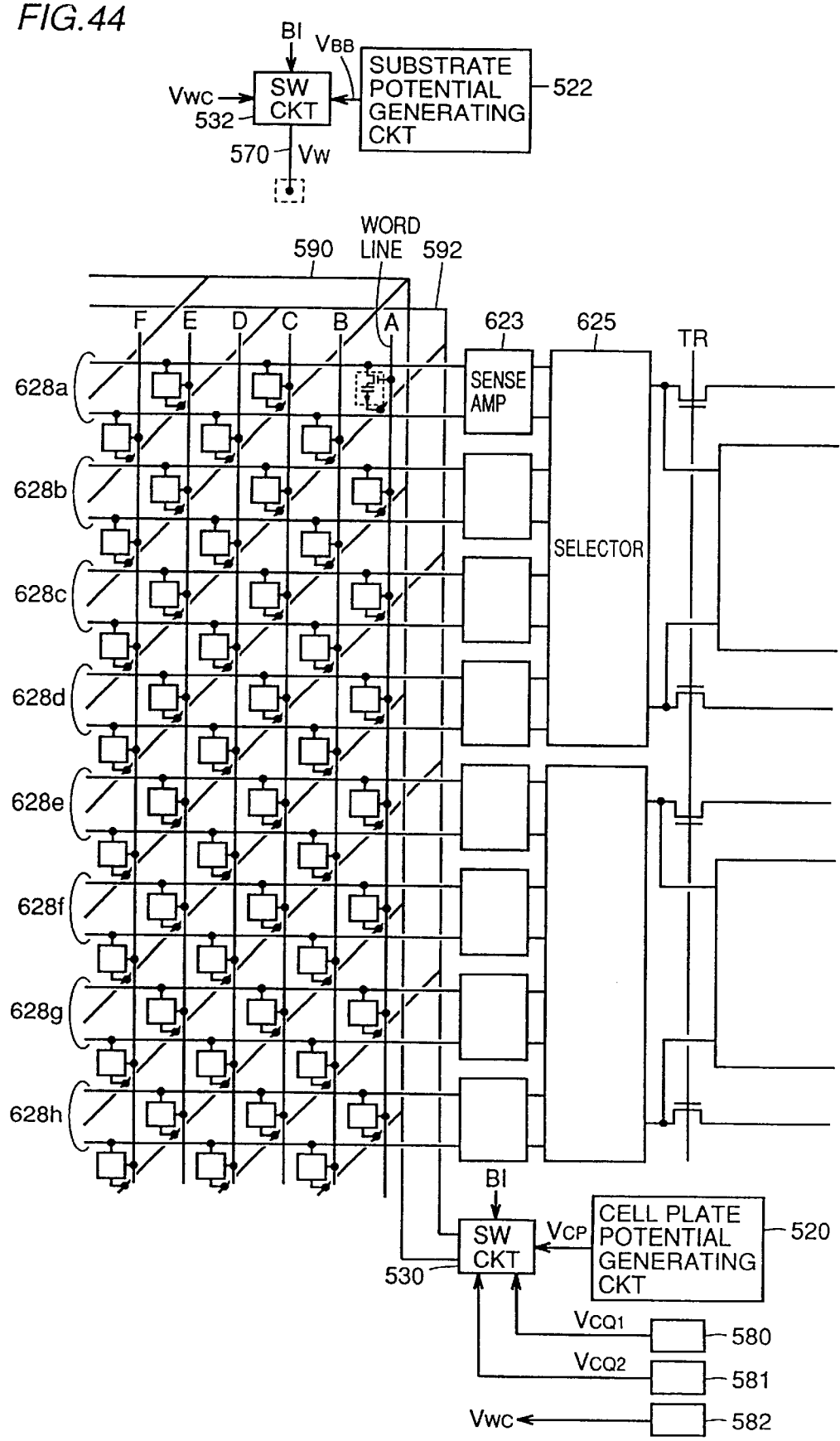
FIG. 44 is a schematic block diagram showing a main portion of a semiconductor memory device in accordance with a thirteenth embodiment of the present invention.

FIG. 44 is a schematic block diagram showing a structure of the semiconductor memory device 1 in accordance with the thirteenth embodiment.

In the twelfth embodiment, the potential between first cell plate interconnection 520 and P well interconnection 570 and the potential between the second cell plate interconnection 592 and P well interconnection 570 are controlled by cell plate potential/P well potential setting circuit 524. However, in the thirteenth embodiment, these are controlled by external terminals 580, 581, 582, as in the eleventh embodiment.

The present invention is similar to the eleventh embodiment except that different test data can be collectively written to the memory cells connected to the first cell plate 590 and the memory cells connected to the second cell plate 522 independent from each other. Therefore, detailed description thereof is not repeated.

By the structure shown in FIG. 44, it becomes possible to write data to the memory cells such that "H" level data and "L" level data are arranged alternately for the memory cells connected to the same word line by means of an external tester, and hence influence of interference between memory cells on the data can be detected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A parallel tester, for performing operation tet of a plurality of semiconductor memory devices parallel to and in synchronization with each other in accordance with an externally input external clock signal, wherein said plurality of semiconductor memory devices are divided into a plurality of subgroups;

said parallel tester comprising internal test clock generating means provided for each one of said subgroups, for receiving said external clock signal and for generating a synchronized internal test clock signal; and a data bus line for transmitting said internal test clock signal to each of the semiconductor memory devices of said subgroup.

* * * * *